(12) United States Patent
Ito

(10) Patent No.: US 11,067,731 B2
(45) Date of Patent: Jul. 20, 2021

(54) TRANSFER BODY FOR OPTICAL FILM, OPTICAL FILM, ORGANIC ELECTROLUMINESCENT DISPLAY DEVICE, AND METHOD FOR MANUFACTURING OPTICAL FILM

(71) Applicant: ZEON CORPORATION, Tokyo (JP)

(72) Inventor: Manabu Ito, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 0 days.

(21) Appl. No.: 15/551,321

(22) PCT Filed: Feb. 25, 2016

(86) PCT No.: PCT/JP2016/055682
§ 371 (c)(1),
(2) Date: Aug. 16, 2017

(87) PCT Pub. No.: WO2016/136901
PCT Pub. Date: Sep. 1, 2016

(65) Prior Publication Data
US 2018/0039005 A1 Feb. 8, 2018

(30) Foreign Application Priority Data
Feb. 26, 2015 (JP) .............................. JP2015-036854

(51) Int. Cl.
G02B 5/30 (2006.01)
H01L 51/50 (2006.01)
(Continued)

(52) U.S. Cl.
CPC .............. *G02B 5/3016* (2013.01); *C09J 5/00* (2013.01); *C09J 133/14* (2013.01);
(Continued)

(58) Field of Classification Search
CPC ... G02B 5/3016; H01L 51/5281; H01L 51/56; H01L 51/0076
See application file for complete search history.

(56) References Cited

U.S. PATENT DOCUMENTS 5,132,147 A 7/1992 Takiguchi et al.
5,833,880 A 11/1998 Siemensmeyer et al.
(Continued)

FOREIGN PATENT DOCUMENTS

CN 104277720 A 1/2015
CN 104339796 A 2/2015
(Continued)

OTHER PUBLICATIONS

May 24, 2016, International Search Report issued in the International Patent Application No. PCT/JP2016/055682.
(Continued)

*Primary Examiner* — Michael H Caley
*Assistant Examiner* — Agnes Dobrowolski
(74) *Attorney, Agent, or Firm* — Kenja IP Law PC

(57) ABSTRACT

An optical film transfer body including a substrate film, and an optically anisotropic layer that is formed on the substrate film by curing a composition containing a photopolymerizable liquid crystal compound, wherein the optically anisotropic layer contains 25% by weight or less of the photopolymerizable liquid crystal compound; an optical film including, in this order, an adherend, an adhesive layer, and an optically anisotropic layer, wherein the adhesive layer is a layer formed by curing a photocurable adhesive, the optically anisotropic layer is a layer formed by curing a composition containing a photopolymerizable liquid crystal compound, and the optically anisotropic layer contains 25% by weight or less of the photopolymerizable liquid crystal (Continued)

compound; as well as a method for producing an optical film and an organic electroluminescent display device.

18 Claims, 1 Drawing Sheet

(51) Int. Cl.
| | |
|---|---|
| *C09J 5/00* | (2006.01) |
| *C09J 133/14* | (2006.01) |
| *H01L 51/00* | (2006.01) |
| *H01L 51/56* | (2006.01) |
| *B05D 1/26* | (2006.01) |
| *B05D 3/06* | (2006.01) |
| *H01L 51/52* | (2006.01) |

(52) U.S. Cl.
CPC ........ *H01L 51/004* (2013.01); *H01L 51/0076* (2013.01); *H01L 51/50* (2013.01); *H01L 51/56* (2013.01); *B05D 1/265* (2013.01); *B05D 3/067* (2013.01); *C09J 2203/326* (2013.01); *C09J 2301/414* (2020.08); *C09J 2433/00* (2013.01); *G02B 5/3083* (2013.01); *H01L 51/5281* (2013.01)

(56) References Cited

U.S. PATENT DOCUMENTS

| | | | |
|---|---|---|---|
| 5,853,801 | A | 12/1998 | Suga et al. |
| 2002/0036285 | A1 | 3/2002 | Prechtl et al. |
| 2004/0075080 | A1 | 4/2004 | Prechtl et al. |
| 2008/0158499 | A1* | 7/2008 | Lai .................. G02F 1/133528 349/162 |
| 2009/0137761 | A1 | 5/2009 | Irisawa et al. |
| 2009/0208673 | A1 | 8/2009 | Seki et al. |
| 2009/0237599 | A1* | 9/2009 | Nagai .................. G02B 5/3016 349/76 |
| 2009/0247782 | A1 | 10/2009 | Irisawa et al. |
| 2010/0157204 | A1 | 6/2010 | Ichihashi et al. |
| 2011/0025966 | A1 | 2/2011 | Sakai et al. |
| 2011/0181814 | A1 | 7/2011 | Sakai |
| 2012/0188492 | A1 | 7/2012 | Sakai et al. |
| 2014/0142266 | A1 | 5/2014 | Sakamoto et al. |
| 2015/0017448 | A1* | 1/2015 | Suwa .................... C09J 133/14 428/414 |
| 2015/0041051 | A1 | 2/2015 | Kobayashi |
| 2015/0042942 | A1 | 2/2015 | Hatanaka et al. |
| 2015/0277010 | A1 | 10/2015 | Aimatsu et al. |
| 2016/0145363 | A1 | 5/2016 | Sakamoto et al. |
| 2016/0146995 | A1* | 5/2016 | Kasai .................. G02B 5/3016 349/194 |
| 2016/0200841 | A1* | 7/2016 | Sakamoto ............. C08F 122/12 526/257 |
| 2018/0044563 | A1 | 2/2018 | Suwa et al. |
| 2018/0259699 | A1 | 9/2018 | Aimatsu et al. |

FOREIGN PATENT DOCUMENTS

| | | | |
|---|---|---|---|
| CN | 104345368 | A | 2/2015 |
| JP | H039325 | A | 1/1991 |
| JP | H0416919 | A | 1/1992 |
| JP | H0688909 | A | 3/1994 |
| JP | H0850206 | A | 2/1996 |
| JP | H0973081 | A | 3/1997 |
| JP | 2818983 | B2 | 10/1998 |
| JP | H1152131 | A | 2/1999 |
| JP | H11513360 | A | 11/1999 |
| JP | 2002030042 | A | 1/2002 |
| JP | 2002321302 | A | 11/2002 |
| JP | 2003177242 | A | 6/2003 |
| JP | 2004204190 | A | 7/2004 |
| JP | 2005263789 | A | 9/2005 |
| JP | 2006285208 | A | 10/2006 |
| JP | 2007119415 | A | 5/2007 |
| JP | 2007186430 | A | 7/2007 |
| JP | 2007277462 | A | 10/2007 |
| JP | 2008282009 | * | 4/2008 |
| JP | 2008282009 | A | 11/2008 |
| JP | 2009116002 | A | 5/2009 |
| JP | 2010008928 | A | 1/2010 |
| JP | 2010126583 | A | 6/2010 |
| JP | 2013210512 | A | 10/2013 |
| WO | 2010087058 | A1 | 8/2010 |
| WO | 2012147904 | A1 | 11/2012 |
| WO | 2014065243 | A1 | 5/2014 |

OTHER PUBLICATIONS

C. Destrade et al., Disc-Like Mesogens: A Classification, Molecular Crystals and Liquid Crystals, 1981, pp. 111-135, vol. 71.

Japan Institute for Promoting Invention and Innovation, Journal of technical disclosure No. 2001-1745, Mar. 15, 2001.

Jinshan Zhang et al., Liquid Crystals Based on Shape-Persistent Macrocyclic Mesogens, J. Am. Chem. Soc., 1994, pp. 2655, vol. 116.

The Chemical Society of Japan, Chemistry of Liquid Crystal, Kikan Kagaku Sosetsu, 1994, No. 22, Chapter 5 and Chapter 10 Section 2 .

Aug. 29, 2017, International Preliminary Report on Patentability issued in the International Patent Application No. PCT/JP2016/055682.

* cited by examiner

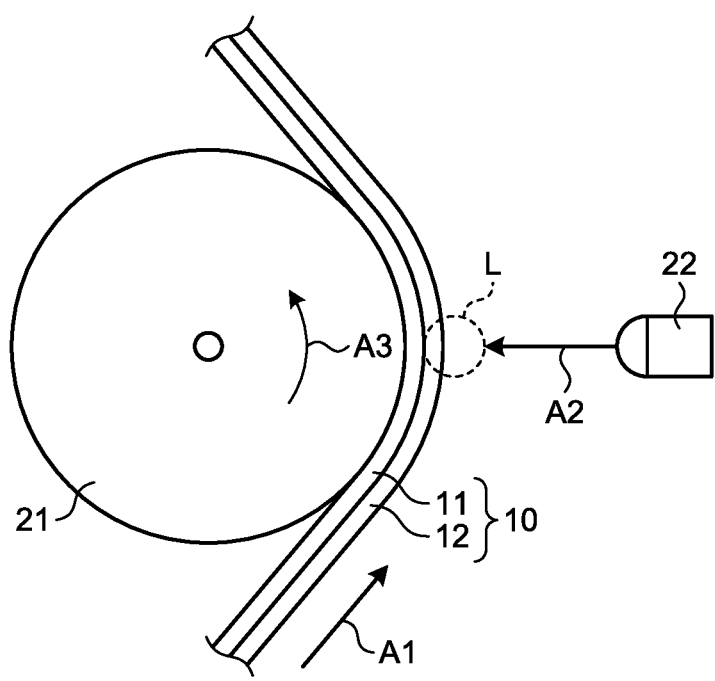

TRANSFER BODY FOR OPTICAL FILM, OPTICAL FILM, ORGANIC ELECTROLUMINESCENT DISPLAY DEVICE, AND METHOD FOR MANUFACTURING OPTICAL FILM

FIELD

The present invention relates to an optical film transfer body to be used in production of an optical film, an optical film, an organic electroluminescent display device, and a method for producing the optical film.

BACKGROUND

Optical films including an optically anisotropic layer (i.e., a layer having optical anisotropy) are known to be used as components of display devices, such organic electroluminescent display devices and liquid crystal display devices. Such optical films may be used, for example, in order to reduce reflection of outside light off the display surface of display devices or to improve the display quality when display devices are observed in a diagonal direction.

As one example of production methods for such an optical film including an optically anisotropic layer, techniques for forming an optically anisotropic layer by applying a liquid crystal composition (a composition containing a photopolymerizable liquid crystal compound) onto a substrate film and curing the liquid crystal composition are known (for example, Patent Literatures 1 and 2). It is known that the use of a substrate film having a surface to which an orientation-regulating force is imparted can cause orientation of a photopolymerizable liquid crystal compound and impart optical anisotropy to the resulting layer (for example, Patent Literatures 3 and 4). By these methods, optically anisotropic layers that exhibit a controlled phase difference and a controlled orientation direction can be produced easily. A method wherein an optically anisotropic layer formed on an orientation substrate plate is transferred onto a different substrate by using an adhesive is also known (for example, Patent Literature 5). In addition, use of an acrylic adhesive taking advantage of its adhesiveness to an optically anisotropic layer and ease of handling is also known (for example, Patent Literature 6).

CITATION LIST

Patent Literature

Patent Literature 1: Japanese Patent Application Laid-Open No. Hei. 11-52131 A

Patent Literature 2: Japanese Patent Application Laid-Open No. Hei. 9-73081 A (foreign counterpart publication: U.S. Pat. No. 5,853,801)

Patent Literature 3: Japanese Patent Application Laid-Open No. Hei. 3-9325 A (foreign counterpart publication: U.S. Pat. No. 5,132,147)

Patent Literature 4: Japanese Patent Application Laid-Open No. Hei. 4-16919 A

Patent Literature 5: Japanese Patent Application Laid-Open No. 2009-116002 A

Patent Literature 6: Japanese Patent Application Laid-Open No. 2007-277462 A (foreign counterpart publication: U.S. Patent Application Publication No. 2009/208673)

SUMMARY

Technical Problem

When an optically anisotropic layer obtained by curing of a liquid crystal composition is attached to another layer to be used for constituting a display device for effecting transfer, such attachment is often performed by using an adhesive. In this case, the phase difference of the optically anisotropic layer may be undesirably reduced because of an uncured adhesive being in contact with the optically anisotropic layer. If this phenomenon occurs, problems such as a heterogeneous phase difference of the optically anisotropic layer and insufficient expression of phase difference arise.

An object of the present invention is to provide an optical film transfer body and an optical film that include an optically anisotropic layer formed by curing a liquid crystal composition and with which a decrease in phase difference due to contact between an adhesive and the optically anisotropic layer is small, to provide a method for producing such an optical film, and to provide an organic electroluminescent display device including such an optical film.

Solution to Problem

As a result of studies in order to solve the above-mentioned problems, the inventors of the present invention have found that the amount of decrease in phase difference due to contact between an adhesive and an optically anisotropic layer can be reduced by setting the ratio of an unreacted photopolymerizable liquid crystal compound in the optically anisotropic layer to a certain value or lower and have completed the present invention on the basis of such a finding.

Accordingly, the present invention provides the following.

(1) An optical film transfer body comprising a substrate film, and an optically anisotropic layer that is formed on the substrate film by curing a composition containing a photopolymerizable liquid crystal compound,
wherein the optically anisotropic layer contains 25% by weight or less of the photopolymerizable liquid crystal compound.

(2) The optical film transfer body according to (1), wherein the substrate film is a resin film containing an alicyclic structure-containing polymer.

(3) The optical film transfer body according to (1) or (2), wherein the substrate film is a stretched film.

(4) The optical film transfer body according to (3), wherein the stretched film is a diagonally stretched film.

(5) The optical film transfer body according to any one of (1) to (4), wherein the optically anisotropic layer contains cured liquid crystal molecules horizontally oriented relative to the substrate film.

(6) An optical film comprising, in this order, an adherend, an adhesive layer, and an optically anisotropic layer, wherein
the adhesive layer is a layer formed by curing a photocurable adhesive,
the optically anisotropic layer is a layer formed by curing a composition containing a photopolymerizable liquid crystal compound, and
the optically anisotropic layer contains 25% by weight or less of the photopolymerizable liquid crystal compound.

(7) The optical film according to (6), wherein the photocurable adhesive contains 50% by weight or more of a (meth)acrylate monomer having a hydroxyl group.

(8) The optical film according to (6) or (7), wherein
the adherend is a polarizing film, and
the optical film is a circularly polarizing plate.

(9) The optical film according to any one of (6) to (8), wherein a phase difference of the optically anisotropic layer is 140±30 nm.

(10) The optical film according to any one of (6) to (9), wherein the optically anisotropic layer has inverse wavelength dispersion.

(11) An organic electroluminescent display device comprising the optical film according to any one of (6) to (10).

(12) A method for producing the optical film according to any one of (6) to (10), comprising:

Step (A) of preparing an optical film transfer body including a substrate film and an optically anisotropic layer formed on the substrate film by curing a composition containing a photopolymerizable liquid crystal compound;

Step (B) of applying a photocurable adhesive onto an adherend to form a layer of the photocurable adhesive;

Step (C) of attaching the optical film transfer body to the layer of the photocurable adhesive;

Step (D) of curing the layer of the photocurable adhesive by irradiating the layer of the photocurable adhesive with light to form an adhesive layer to provide a layered body including, in this order, the adherend, the adhesive layer, the optically anisotropic layer, and the substrate film; and Step (E) of separating the substrate film from the layered body.

(13) The method for producing the optical film according to (12), wherein the adherend is a polarizing film.

(14) The method for producing the optical film according to (12) or (13), wherein, in Step (D), the light irradiation is performed from a side of the substrate film.

Advantageous Effects of Invention

The optical film transfer body of the present invention includes a particular optically anisotropic layer formed by curing a liquid crystal composition and exhibits a small decrease in phase difference due to contact between an adhesive and the optically anisotropic layer. This optical film transfer body is thus useful as a material for producing the optical film of the present invention and the organic electroluminescent display device of the present invention that include an optically anisotropic layer that exhibits a uniform phase difference and a large phase difference. The method for producing the optical film of the present invention enables easy production of such an optical film of the present invention.

BRIEF DESCRIPTION OF DRAWINGS

FIG. 1 is a schematic view illustrating an example of the step of light irradiation in a method for producing an optical film of the present invention in which this step is associated with temperature control using a back roll that supports a substrate film from the side opposite to the irradiation-receiving surface.

DESCRIPTION OF EMBODIMENTS

The present invention will be described below in detail by way of embodiments and examples. However, the present invention is not limited to the following embodiments and examples described below and may be freely modified and practiced without departing from the scope of claims of the present invention and the scope of their equivalents.

In the following description, the term "long-length" refers to having a length of 5 or more times the width, preferably having a length of 10 or more times the width, specifically, having a sufficiently long length to be wound in a rolled form for storage or transportation. The upper limit of the ratio of the length relative to the width of a film is not particularly limited and may be, for example, 100,000 times or less.

The terms "substrate" and "polarizing plate" encompass not only a rigid member but also a flexible member such as a resin film.

In the following description, the phase difference in an in-plane direction of a film is a value represented by (nx−ny)×d, unless otherwise specified. In the formula, nx represents a refractive index of the film in the direction that is perpendicular to the thickness direction of the film (in-plane direction) and in which the maximum refractive index is obtained; ny represents a refractive index of the film in the direction that is an in-plane direction of the film and is perpendicular to the direction corresponding to nx; and d represents the thickness of the film. The retardation may be measured by using a commercially available phase-difference measuring device or the Senarmont method.

In the following description, the term "(meth)acrylate" encompasses both "acrylate" and "methacrylate", unless otherwise specified. In the following description, the term "(meth)acryloyl-" encompasses both "acryloyl-" and "methacryloyl-", unless otherwise specified.

[1. Optical Film Transfer Body]

The optical film transfer body of the present invention includes a substrate film and a particular optically anisotropic layer formed on the substrate film.

In the present invention, the term "optical film transfer body" refers to a component including a plurality of layers, a part of which is transferred and used to produce an optical film including the layers. In the optical film transfer body of the present invention, an optically anisotropic layer is used to produce an optical film.

[1.1. Substrate Film: Material]

As the substrate film, a film that can be used as a substrate for an optical layered body may be appropriately selected and used.

The material for the substrate film is not particularly limited, and various resins may be used. Examples of the resins may include resins containing various types of polymers. Examples of the polymers may include an alicyclic structure-containing polymer, a cellulose ester, a polyvinyl alcohol, a polyimide, UV-transmitting acrylic, a polycarbonate, a polysulfone, a polyether sulfone, an epoxy polymer, a polystyrene, and combinations thereof. Among these, an alicyclic structure-containing polymer and a cellulose ester are preferable, and an alicyclic structure-containing polymer is more preferable from the viewpoint of transparency, low hygroscopicity, size stability, and low weight.

The alicyclic structure-containing polymer is an amorphous polymer having an alicyclic structure in a repeating unit. Both a polymer containing an alicyclic structure in a main chain and a polymer containing an alicyclic structure in a side chain may be used.

Examples of the alicyclic structure may include a cycloalkane structure and a cycloalkene structure. A cycloalkane structure is preferable from the viewpoint of thermal stability.

The number of carbon atoms constituting one repeating unit having the alicyclic structure is not particularly limited, but is usually 4 to 30, preferably 5 to 20, and more preferably 6 to 15.

The ratio of the repeating unit having the alicyclic structure in the alicyclic structure-containing polymer is appropriately selected depending on the purposes of use, and is usually 50% by weight or more, preferably 70% by weight or more, and more preferably 90% by weight or more.

When the ratio of the repeating unit having the alicyclic structure is too low, the heat resistance of the film may be decreased.

Specific examples of the alicyclic structure-containing polymer may include (1) a norbornene polymer, (2) a monocyclic olefin polymer, (3) a cyclic conjugated diene polymer, (4) a vinyl alicyclic hydrocarbon polymer, and hydrogenated products thereof.

Among these, a norbornene polymer and a hydrogenated product thereof are more preferable from the viewpoint of transparency and moldability.

Examples of the norbornene polymer may include a ring-opened polymer of a norbornene monomer, a ring-opened copolymer of a norbornene monomer with a ring-opening copolymerizable monomer other than the norbornene monomer, and hydrogenated products thereof; and an addition polymer of a norbornene monomer, and an addition copolymer of a norbornene monomer with a copolymerizable monomer other than the norbornene monomer.

Among these, a hydrogenated product of a ring-opened polymer of a norbornene monomer is the most preferable from the viewpoint of transparency.

The alicyclic structure-containing polymer is, for example, selected from known polymers disclosed in Japanese Patent Application Laid-Open No. 2002-321302 and the like.

The glass transition temperature of the alicyclic structure-containing polymer is preferably 80° C. or higher, and more preferably within a range of 100 to 250° C.

The alicyclic structure-containing polymer having a glass transition temperature falling within this range is not deformed nor generates stress during use at high temperature, and has excellent durability.

The molecular weight of the alicyclic structure-containing polymer as a weight-average molecular weight (Mw) measured by gel permeation chromatography (hereinafter abbreviated as "GPC") using cyclohexane as a solvent (when a resin is not dissolved therein, toluene) in terms of polyisoprene (in terms of polystyrene when the solvent is toluene) is preferably 10,000 to 100,000, more preferably 25,000 to 80,000, and still further preferably 25,000 to 50,000. When the weight-average molecular weight thereof falls within such a range, mechanical strength and molding processability of the film are highly balanced. Therefore, this is suitable.

Although the molecular weight distribution (weight-average molecular weight (Mw)/number-average molecular weight (Mn)) of the alicyclic structure-containing polymer is not particularly limited, it usually falls within a range of 1 to 10, preferably 1 to 4, and more preferably 1.2 to 3.5.

When the resin containing the alicyclic structure-containing polymer is used as the material for the substrate film, the thickness of the substrate film is not particularly limited. However, the thickness of the substrate film preferably falls within a particular range from the viewpoints of increased productivity and facilitation of decrease in thickness and weight. In view of such objects, the thickness is usually 1 to 1,000 μm, preferably 5 to 300 μm, and more preferably 30 to 100 μm.

The resin containing the alicyclic structure-containing polymer may be composed only of the alicyclic structure-containing polymer. Alternatively, the resin may contain any compounding agent as long as the effects of the present invention are not significantly impaired. The ratio of the alicyclic structure-containing polymer in the resin containing the alicyclic structure-containing polymer is preferably 70% by weight or more, and more preferably 80% by weight or more.

Specific suitable examples of the resin containing the alicyclic structure-containing polymer may include "ZEONOR 1420 and ZEONOR 1420R" manufactured by ZEON Corporation.

A typical example of the cellulose ester is a lower fatty acid ester of cellulose (for example, cellulose acetate, cellulose acetate butyrate, and cellulose acetate propionate). A lower fatty acid means a fatty acid having 6 or less carbon atoms in one molecule. Cellulose acetate includes triacetylcellulose (TAC) and cellulose diacetate (DAC).

The acetylation degree of cellulose acetate is preferably 50 to 70%, and particularly preferably 55 to 65%. The weight-average molecular weight of cellulose acetate is preferably 70,000 to 120,000, and particularly preferably 80,000 to 100,000. The aforementioned cellulose acetate may be partially esterified with not only acetic acid but also a fatty acid, such as propionic acid and butyric acid, as long as the aforementioned acetylation degree is satisfied. The resin constituting the substrate film may contain cellulose acetate in combination with a cellulose ester other than cellulose acetate (cellulose propionate, cellulose butyrate, etc.). In this case, it is preferable that the all of the cellulose esters satisfy the aforementioned acetylation degree.

When a film of triacetylcellulose is used as the substrate film, it is particularly preferable that such a film is a triacetylcellulose film formed using triacetylcellulose dope that is prepared by dissolving triacetylcellulose in a solvent essentially free of dichloromethane by a low-temperature dissolution method or a high-temperature dissolution method, from the viewpoint of environmental conservation. The film of triacetylcellulose may be produce by a co-casting method. The co-casting method may be performed by dissolving raw material flakes of triacetylcellulose in a solvent, and if necessary, adding an optional additive to prepare a solution (dope), casting the dope on a support from a dope supply device (die), drying the cast product to some extent, separating the cast product as a film from the support when rigidity has been imparted, and further drying the film to remove the solvent. Examples of the solvent for dissolving the raw material flakes may include halogenated hydrocarbons (dichloromethane, etc.), alcohols (methanol, ethanol, butanol, etc.), esters (methyl formate, methyl acetate, etc.), and ethers (dioxane, dioxolane, diethyl ether, etc.). Examples of the additive added to the dope may include a retardation-increasing agent, a plasticizer, an ultraviolet ray absorber, a deterioration preventing agent, a lubricant, and a separation promoter. Examples of the support on which the dope is cast may include a horizontal endless metal belt and a rotation drum. For casting, a single dope may be cast to be a single layer. Alternatively, co-casting of a plurality of layers may be performed. In co-casting of a plurality of layers, for example, a plurality of dopes may be successively cast so that a layer of a low-concentration cellulose ester dope and layers of a high-concentration cellulose ester dope in contact with the front and back surfaces of the layer of the low-concentration cellulose ester dope are formed. Examples of devices for drying the film to remove the solvent may include devices for conveying the film to pass the film through a drying unit the interior portion of which is set to conditions suitable for drying.

Preferable examples of the film of triacetylcellulose may include known films such as TAC-TD80U (manufactured by Fuji Photo Film Co., Ltd.), and a film disclosed in JIII journal of technical disclosure No. 2001-1745. Although the thickness of the film of triacetylcellulose is not particularly limited, it is preferably 20 to 150 μm, more preferably 40 to 130 μm, and further preferably 70 to 120 μm.

[1.2. Substrate Film: Orientation-Regulating Force]

As the substrate film, a film having an orientation-regulating force may be used. The orientation-regulating force of the substrate film refers to a property of the substrate film that causes orientation of a photopolymerizable liquid crystal compound in a liquid crystal composition applied onto the substrate film.

The orientation-regulating force may be imparted by subjecting a film serving as a material of the substrate film to a treatment for imparting an orientation-regulating force. Examples of such a treatment may include a stretching treatment and a rubbing treatment.

In a preferred aspect, the substrate film is a stretched film. This stretched film may have an orientation-regulating force according to the stretching direction.

In a more preferred aspect, the substrate film is a diagonally stretched film. More specifically, the substrate film is a long-length film and is a film stretched in a direction that is not parallel to the long-length direction nor to the short-length direction of the film.

When the substrate film is a diagonally stretched film, the angle formed between the stretching direction and the short-length direction of the substrate film may be specifically more than 0° and less than 90°. Use of such a diagonally stretched film provides a material that enables, for example, a circularly polarizing plate to be effectively produced by transferring and stacking an optically anisotropic layer on a long-length polarizer by a roll-to-roll operation.

In a certain aspect, the angle formed between the stretching direction and the short-length direction of the substrate film may be in a particular range, preferably 15°±5°, 22.5±5°, 45°±5°, or 75°±5°, more preferably 15°±4°, 22.5°±4°, 45°±4°, or 75°±4°, and still more preferably 15°±3°, 22.5°±3°, 45°±3°, or 75°±3°. The optical film transfer body of the present invention having such an angle relationship can be used as a material that enables efficient production of a particular circularly polarizing plate.

[1.3. Optically Anisotropic Layer: Formation Method]

The optically anisotropic layer is a layer formed on the substrate film by curing a composition containing a photopolymerizable liquid crystal compound. Herein, the composition containing a photopolymerizable liquid crystal compound may be simply referred to as a "liquid crystal composition".

The operation for curing the liquid crystal composition to form an optically anisotropic layer on the substrate film may be typically performed by a method including:

Step (I): a step of applying the liquid crystal composition onto the substrate film to form a layer of the liquid crystal composition, Step (II): a step of effecting orientation of the photopolymerizable liquid crystal compound in the layer of the liquid crystal composition, and Step (III): a step of polymerizing the photopolymerizable liquid crystal compound to form cured liquid crystal molecules.

Step (I) may be performed by, for example, applying the liquid crystal composition directly onto one surface of a long-length substrate film that is continuously conveyed. Examples of the application method may include a curtain coating method, an extrusion coating method, a roll coating method, a spin coating method, a dip coating method, a bar coating method, a spray coating method, a slide coating method, a printing coating method, a gravure coating method, a die coating method, a cap coating method, and a dipping method. The thickness of the layer of the liquid crystal composition applied may be appropriately set according to a desired thickness needed for the optically anisotropic layer.

Step (II) may be achieved immediately by application, and may also be achieved by performing an orientation treatment such as heating after application if necessary. The conditions for the orientation treatment may be appropriately set according to the properties of the liquid crystal composition used. For example, the orientation treatment may be performed under a temperature condition of 50 to 160° C. for 30 seconds to 5 minutes.

Sep (III) may be performed immediately after Step (II), but a step of drying the layer of the liquid crystal composition may be performed if necessary at an appropriate time, for example, after Step (II) and before Step (III). Such drying may be achieved by a drying method, such as air drying, heated-air drying, drying under reduced pressure, and heated-air drying under reduced pressure. Such drying can remove a solvent from the layer of the liquid crystal composition.

Step (III) may be performed by an appropriately selected method suitable for the properties of components of the liquid crystal composition, such as a polymerizable compound and a polymerization initiator. For example, Step (III) is preferably performed by light irradiation. Examples of light used for irradiation may include light such as visible rays, ultraviolet rays, and infrared rays. In particular, ultraviolet irradiation is preferred because of a simple operation.

The irradiation intensity of ultraviolet rays when ultraviolet irradiation is performed in Step (III) is usually in the range of 0.1 mW/cm$^2$ to 1000 mW/cm$^2$, and preferably in the range of 0.5 mW/cm$^2$ to 600 mW/cm$^2$. The irradiation time of ultraviolet rays is in the range of 1 second to 300 seconds, and preferably in the range of 5 seconds to 100 seconds. The integrated light amount of ultraviolet rays (mJ/cm$^2$) is obtained from the irradiation intensity of ultraviolet rays (mW/cm$^2$)×the irradiation time (second). As a light source for ultraviolet irradiation, a high-pressure mercury-vapor lamp, a metal-halide lamp, and a low-pressure mercury-vapor lamp may be used.

[1.4. Residual Monomer Ratio in Optically Anisotropic Layer]

The optically anisotropic layer in the optical film transfer body of the present invention includes 25% by weight or less of the photopolymerizable liquid crystal compound. In other words, given that the weight of the optically anisotropic layer is 100% by weight, the ratio of the photopolymerizable liquid crystal compound contained in the anisotropic layer is 25% by weight or less. Herein, the ratio of such a photopolymerizable liquid crystal compound in the optically anisotropic layer may be simply referred to as a "residual monomer ratio".

The residual monomer ratio is preferably 20% by weight or less, more preferably 10% by weight or less, and still more preferably 6% by weight or less. The lower limit of the residual monomer ratio is ideally 0% by weight. From the viewpoint of realistic reaction rate and ease of production, the residual monomer ratio may be 2% by weight or more.

The residual monomer ratio may be obtained by extracting the photopolymerizable liquid crystal compound from the optically anisotropic layer to obtain an extraction solution and determining the amount of the photopolymerizable liquid crystal compound in the extraction solution. The amount of the photopolymerizable liquid crystal compound in the extraction solution may be determined by a quantitative analytical method, such as gas chromatography.

A residual monomer is a photopolymerizable liquid crystal compound that has not been polymerized in forming the optically anisotropic layer. The residual monomer ratio can be reduced to a desired low value by changing the polymerization conditions in forming the optically anisotropic layer. For example, the residual monomer ratio can be reduced by controlling the temperature of the layer of the liquid crystal composition in Step (III) of the method for forming the optically anisotropic layer including Steps (I) to (III) described above.

The temperature of the layer of the liquid crystal composition in Step (III) is controlled by controlling the temperature of a back roll in Step (III) while the back roll supports the substrate film.

The back roll is a roll that supports the substrate film from the side opposite to the irradiation-receiving surface during light irradiation. FIG. 1 is a schematic view illustrating an example of Step (III) associated with temperature control using such a back roll. In FIG. 1, a layered body 10 including a substrate film 11 and a layer 12 of a liquid crystal composition disposed on the substrate film 11 is conveyed in the direction of an arrow A1. The layered body 10 is conveyed while the layered body 10 is supported by, at a position L, a back roll 21 rotating in the direction of the arrow A3 such that the surface of the layered body 10 on the substrate film 11 side is in contact with the back roll 21. At the position L, the layer 12 of the liquid crystal composition is cured by ultraviolet irradiation from a light source 22 in the direction of the arrow A2. Curing the layer of the liquid crystal composition forms the optically anisotropic layer. In this case, curing with a low residual monomer ratio can be achieved by controlling the temperature of the back roll in various ways. In general, a higher temperature of the back roll tends to result in a lower residual monomer ratio. However, since an optimum temperature changes with other conditions, it is preferable to experimentally set the temperature at which the residual monomer ratio is reduced. In addition, the residual monomer ratio can also be reduced by increasing the irradiance of light or increasing the amount of a polymerization initiator.

The upper limit of the temperature of the back roll is preferably equal to or lower than the glass transition temperature (Tg) of the substrate in order to avoid deformation of the substrate film. The temperature of the back roll is usually 150° C. or lower, preferably 100° C. or lower, and more preferably 80° C. or lower. The lower limit of the temperature of the back roll may be 15° C. or higher. Preferably, the temperature at which the residual monomer ratio is reduced may be experimentally set in this temperature range.

Since the residual monomer ratio tends to be lower when Step (III) is performed in an inert gas atmosphere such as a nitrogen atmosphere than when Step (III) is performed in the air, Step (III) is preferably performed in such an inert gas atmosphere.

[1.5. Rate of Decrease in Phase Difference of Optically Anisotropic Layer]

According to the finding of the inventors of the present invention, the rate of decrease in phase difference when an adhesive is brought into contact with the optically anisotropic layer can be reduced to a low value by controlling the residual monomer ratio at a low value equal to or lower than the above-mentioned upper limit.

The rate of decrease in the phase difference of the optically anisotropic layer may be obtained by measuring the phase difference in the in-plane direction $Re_0$ before applying the adhesive and the phase difference in the in-plane direction $Re_1$ after applying the adhesive. Specifically, the rate (%) of decrease in phase difference may be obtained from the formula of $((Re_0-Re_1)/Re_0)\times100$ by measuring the phase difference in the in-plane direction $Re_0$ at 550 nm after transferring the optically anisotropic layer in the optical film transfer body onto a suitable substrate for phase difference measurement and further measuring the phase difference $Re_1$ 10 minutes after applying the adhesive onto the surface of the optically anisotropic layer. As the substrate for phase difference measurement, a substrate suitable for phase difference measurement, such as a glass plate, may be appropriately selected. As a device for measuring the phase difference, a phase difference meter (for example, trade name "AxoScan" manufactured by Axometrics, Inc.) may be used.

As the adhesive for evaluating the rate of decrease in the phase difference of the optically anisotropic layer, the same adhesive as that used for producing the optical film of the present invention may be used. The thickness of the adhesive applied may be a thickness with which decreases in phase difference can be sufficiently observed, specifically, may be 1 mm.

[1.6. Optical Properties, etc. of Optically Anisotropic Layer]

The optically anisotropic layer usually includes cured liquid crystal molecules formed from a photopolymerizable liquid crystal compound. As used herein, the term "cured liquid crystal molecule" refers to a molecule of a solidified compound, wherein the compound which is capable of exhibiting a liquid crystal phase has been solidified while keeping the state of exhibiting the liquid crystal phase. Examples of the cured liquid crystal molecule may include polymers formed by polymerizing the photopolymerizable liquid crystal compound.

The cured liquid crystal molecules may preferably have orientation regularity of being horizontally oriented relative to the substrate film. That the cured liquid crystal molecules are "horizontally oriented" relative to the substrate film means that the cured liquid crystal molecules are aligned in one direction such that the average direction of the longitudinal directions of mesogens of the cured liquid crystal molecules is parallel to or substantially parallel to the film face (for example, the angle formed between the average direction and the film face is within 5°). Whether the cured liquid crystal molecules are horizontally oriented and the alignment direction thereof may be determined by measurements using a phase difference meter, such as AxoScan (manufactured by Axometrics, Inc.).

When the cured liquid crystal molecules are ones formed by polymerizing a photopolymerizable liquid crystal compound having a rod-like molecular structure, the longitudinal direction of the mesogen of the photopolymerizable liquid crystal compound usually corresponds to the longitudinal direction of the mesogen of the cured liquid crystal molecule. When a plurality of types of mesogens oriented in different directions are present in the optically anisotropic layer as in the case where a photopolymerizable liquid crystal compound having inverse wavelength dispersion (described below) is used as a photopolymerizable liquid crystal compound, the alignment direction is the direction along which the longitudinal direction of the longest type of mesogen among them aligns.

The cured liquid crystal molecules can be horizontally oriented in the optically anisotropic layer by using a substrate film having an orientation-regulating force and appropriately selecting the material of the optically anisotropic layer.

The thickness of the optically anisotropic layer is not particularly limited. The thickness may be appropriately adjusted so that characteristics such as a phase difference in the in-plane direction fall within a desired range. Specifically, the lower limit of the thickness is preferably 0.5 μm or more, and more preferably 1.0 μm or more. On the other hand, the upper limit of the thickness is preferably 10 μm or less, more preferably 7 μm or less, and further preferably 5 μm or less.

It is preferable that the optically anisotropic layer has inverse wavelength dispersion. That is, it is preferable that the optically anisotropic layer has wavelength dispersion that exhibits higher in-plane phase difference for transmission of light having longer wavelength as compared with transmission of light having shorter wavelength. It is preferable that the optically anisotropic layer has inverse wavelength dispersion at at least a part of or preferably the full range of visible light region. When the optically anisotropic layer has inverse wavelength dispersion, the function for optical applications such as a λ/4 wave plate and a λ/2 wave plate can be uniformly expressed over a wide region.

Since the optically anisotropic layer has optical anisotropy, it gives a phase difference to light passing through the optically anisotropic layer. In a preferred aspect, the optically anisotropic layer is a λ/4 wave plate or a λ/2 wave plate. Specifically, when the phase difference in the in-plane direction Re measured at a measurement wavelength of 550 nm falls within a range of 108 nm to 168 nm, the optically anisotropic layer can be used as a λ/4 wave plate. When the phase difference in the in-plane direction Re measured at a measurement wavelength of 550 nm falls within a range of 245 nm to 305 nm, the optically anisotropic layer can be used as a λ/2 wave plate. More specifically, in a case of the λ/4 wave plate, the phase difference in the in-plane direction Re measured at a measurement wavelength of 550 nm preferably falls within a range of 110 nm to 170 nm (i.e., 140±30 nm), more preferably 128 nm to 148 nm, and further more preferably 135 nm to 145 nm (i.e., 140±5 nm). In a case of the λ/2 wave plate, the in-plane retardation Re measured at a measurement wavelength of 550 nm preferably falls within a range of 265 nm to 285 nm, and more preferably 270 nm to 280 nm. When the optically anisotropic layer is such a λ/4 wave plate or such a λ/2 wave plate, an optical element such as a circularly polarizing plate having the λ/4 wave plate or the λ/2 wave plate can be easily produced using the optically anisotropic layer.

In a preferred aspect, the substrate film is a long-length film, and therefore the optically anisotropic layer to be formed on the surface of the substrate film may also be in a long-length shape. When the optically anisotropic layer has a long-length shape, the angle formed between the slow axis of the optically anisotropic layer and the short-length direction of the optically anisotropic layer may be the same as the angle formed between the direction of the orientation-regulating force of the substrate film and the short-length direction of the substrate film. Specifically, when the substrate film is a diagonally stretched film and has an orientation-regulating force along the stretching direction, the angle formed between the slow axis of the optically anisotropic layer and the short-length direction of the optically anisotropic layer is specifically more than 0° and less than 90°. In a certain aspect, the angle formed between the slow axis of the optically anisotropic layer and the short-length direction of the optically anisotropic layer preferably falls within a specific range of 15°±5°, 22.5°±5°, 45°±5°, or 75°±5°, more preferably 15°±4°, 22.5°±4°, 45°±4°, or 75°±4°, and further preferably 15°±3°, 22.5°±3°, 45°±3°, or 75°±3°. When the optically anisotropic layer has such an angle relationship, the optical film transfer body of the present invention can be a material capable of efficiently producing a specific circularly polarizing plate.

[1.7. Material of Optically Anisotropic Layer: Liquid Crystal Composition]

The liquid crystal composition that may be used to form the optically anisotropic layer (hereinafter the composition may be abbreviated as a "composition (A)") will be described.

The liquid crystal compound as a component of the composition (A) herein is a compound capable of exhibiting a liquid crystal phase when the compound is mixed in the composition (A) and oriented. The photopolymerizable liquid crystal compound is a liquid crystal compound that is capable of being polymerized in the composition (A) while keeping the state of exhibiting the liquid crystal phase, to form a polymer in which the orientation of molecules in the liquid crystal phase is maintained. Further, the photopolymerizable liquid crystal compound having inverse wavelength dispersion is a photopolymerizable liquid crystal compound in which a polymer obtained as described above exhibits inverse wavelength dispersion.

Herein, compounds having polymerizability (the photopolymerizable liquid crystal compound, other compounds having polymerizability, etc.) as the component of the composition (A) are sometimes collectively referred to simply as "polymerizable compound".

[1.7.1. Photopolymerizable Liquid Crystal Compound]

Examples of the photopolymerizable liquid crystal compound may include a liquid crystal compound having a polymerizable group, a compound capable of forming a side chain-type liquid crystal polymer, and a discotic liquid crystal compound that are polymerizable by irradiation with light such as visible rays, ultraviolet rays, and infrared rays. Examples of the liquid crystal compound having a polymerizable group may include rod-like liquid crystal compounds having a polymerizable group described in Japanese Patent Application Laid-Open Nos. Hei. 11-513360 A, 2002-030042 A, 2004-204190 A, 2005-263789 A, 2007-119415 A, and 2007-186430 A. Examples of the side chain-type liquid crystal polymer compound may include a side chain-type liquid crystal polymer compound described in Japanese Patent Application Laid-Open No. 2003-177242 A. Examples of a product name of a preferred liquid crystal compound may include "LC242" manufactured by BASF. Specific examples of the discotic liquid crystal compound are described in Japanese Patent Application Laid-Open No. Hei. 08-50206 A, and documents (C. Destrade et al., Mol. Crysr. Liq. Cryst., vol. 71, page 111 (1981); Quarterly Chemical Review by the Chemical Society of Japan, No. 22, Chemistry of Liquid Crystals, Chapter 5, Section 2 of Chapter 10 (1994); B. Kohne et al., Angew. Chem. Soc. Chem. Comm., page 1794 (1985); and J. Zhang et al., J. Am. Chem. Soc., vol. 116, page 2655 (1994)). As the liquid crystal compound and the polymerizable liquid crystal compound having inverse wavelength dispersion described below, one type thereof may be solely used, and two or more types thereof may also be used in combination at any ratio.

[1.7.2. Photopolymerizable Liquid Crystal Compound having Inverse Wavelength Dispersion]

As a part of or all of the photopolymerizable liquid crystal compound, a photopolymerizable liquid crystal compound having inverse wavelength dispersion may be used. When the photopolymerizable liquid crystal compound having inverse wavelength dispersion is used, an optically anisotropic layer having inverse wavelength dispersion can be easily obtained.

Examples of the photopolymerizable liquid crystal compound having inverse wavelength dispersion may include a compound having a main chain mesogen and a side chain mesogen bonded to the main chain mesogen in the molecule. In a state where the photopolymerizable liquid crystal compound having inverse wavelength dispersion is oriented, the side chain mesogen can be oriented in a direction different from that of the main chain mesogen. Therefore, the main chain mesogen and the side chain mesogen can be oriented in different directions in the optically anisotropic layer. As a result of such orientation, the optically anisotropic layer can exhibit inverse wavelength dispersion characteristics.

[1.7.2.1. Compound (I)]

Examples of the photopolymerizable liquid crystal compound having inverse wavelength dispersion may include a compound represented by the following formula (I) (hereinafter sometimes referred to as "compound (I)").

carbon atoms and an alkenylene group having 2 to 20 carbon atoms; and a divalent aliphatic group, such as a cycloalkanediyl group having 3 to 20 carbon atoms, a cycloalkenediyl group having 4 to 20 carbon atoms, and a divalent alicyclic fused ring group having 10 to 30 carbon atoms.

Examples of the substituent in the divalent aliphatic group of $G^1$ and $G^2$ may include a halogen atom, such as a fluorine atom, a chlorine atom, a bromine atom, and an iodine atom; and an alkoxy group having 1 to 6 carbon atoms, such as a methoxy group, an ethoxy group, a n-propoxy group, an isopropoxy group, a n-butoxy group, a sec-butoxy group, a t-butoxy group, a n-pentyloxy group, and a n-hexyloxy group. Among these, a fluorine atom, a methoxy group, and an ethoxy group are preferable.

The aforementioned aliphatic groups may have —O—, —S—, —O—C(=O)—, —C(=O)—O—, —O—C(=O)—O—, —NR²—C(=O)—, —C(=O)—NR²—, —NR²—, or —C(=O)— inserted into the groups, provided that cases where two or more —O— or —S— groups are adjacently inserted are excluded. Herein, $R^2$ is a hydrogen atom or an alkyl group having 1 to 6 carbon atoms, which are the same as those for $R^1$. It is preferable that $R^2$ is a hydrogen atom or a methyl group.

It is preferable that the group inserted into the aliphatic groups is —O—, —O—C(=O)—, —C(=O)—O—, or —C(=O)—.

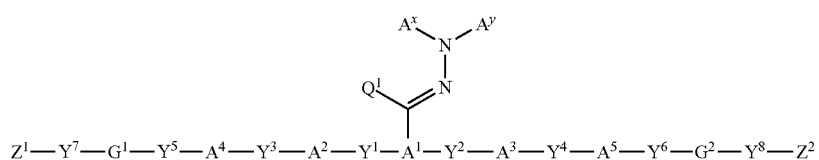

(I)

When the photopolymerizable liquid crystal compound having inverse wavelength dispersion is the compound (I), a —Y⁵-A⁴-Y³-A²-Y¹-A¹-Y²-A³-Y⁴-A⁵-Y⁶— group is the main chain mesogen, and a >A¹-C(Q¹)=N—N(Aˣ)Aʸ group is the side chain mesogen. An A¹ group affects both properties of the main chain mesogen and the side chain mesogen.

In the formula, $Y^1$ to $Y^8$ are each independently a chemical single bond, —O—, —S—, —O—C(=O)—, —C(=O)—O—, —O—C(=O)—O—, —NR¹—C(=O)—, —C(=O)—NR¹—, —O—C(=O)—NR¹—, —NR¹—C(=O)—O—, —NR¹—C(=O)—NR¹—, —O—NR¹—, or —NR¹—O—.

Herein, $R^1$ is a hydrogen atom or an alkyl group having 1 to 6 carbon atoms.

Examples of the alkyl group having 1 to 6 carbon atoms of $R^1$ may include a methyl group, an ethyl group, a n-propyl group, an isopropyl group, a n-butyl group, a sec-butyl group, a t-butyl group, a n-pentyl group, and a n-hexyl group.

It is preferable that $R^1$ is a hydrogen atom or an alkyl group having 1 to 4 carbon atoms.

In the compound (I), it is preferable that $Y^1$ to $Y^8$ are each independently a chemical single bond, —O—, —O—C(=O)—, —C(=O)—O—, or —O—C(=O)—O—.

$G^1$ and $G^2$ are each independently a divalent aliphatic group optionally having a substituent and having 1 to 20 carbon atoms.

Examples of the divalent aliphatic group having 1 to 20 carbon atoms may include a divalent aliphatic group having a linear structure, such as an alkylene group having 1 to 20

Specific examples of the aliphatic groups into which the group is inserted may include —CH₂—CH₂—O—CH₂—CH₂—, —CH₂—CH₂—S—CH₂—CH₂—, —CH₂—CH₂—O—C(=O)—CH₂—CH₂—, —CH₂—CH₂—C(=O)—O—CH₂—CH₂—, —CH₂—CH₂—C(=O)—O—CH₂—, —CH₂—O—C(=O)—O—CH₂—CH₂—, —CH₂—CH₂—NR²—C(=O)—CH₂—CH₂—, —CH₂—CH₂—C(=O)—NR²—CH₂—, —CH₂—NR²—CH₂—CH₂—, and —CH₂—C(=O)—CH₂—.

Among these, from the viewpoint of favorably obtaining the desired effect of the present invention, $G^1$ and $G^2$ are each independently preferably a divalent aliphatic group having a linear structure, such as an alkylene group having 1 to 20 carbon atoms and an alkenylene group having 2 to 20 carbon atoms, more preferably an alkylene group having 1 to 12 carbon atoms, such as a methylene group, an ethylene group, a trimethylene group, a propylene group, a tetramethylene group, a pentamethylene group, a hexamethylene group, an octamethylene group, and a decamethylene group [—(CH₂)₁₀—], and particularly preferably a tetramethylene group [—(CH₂)₄—], a hexamethylene group [—(CH₂)₆—], an octamethylene group [—(CH₂)₈—], or a decamethylene group [—(CH₂)₁₀—].

$Z^1$ and $Z^2$ are each independently an alkenyl group having 2 to 10 carbon atoms that is unsubstituted or substituted by a halogen atom.

It is preferable that the number of carbon atoms in the alkenyl group is 2 to 6. Examples of the halogen atom that is a substituent in the alkenyl group of $Z^1$ and $Z^2$ may include a fluorine atom, a chlorine atom, and a bromine atom. A chlorine atom is preferable.

Specific examples of the alkenyl group having 2 to 10 carbon atoms of $Z^1$ and $Z^2$ may include $CH_2\!=\!CH\!-\!$, $CH_2\!=\!C(CH_3)\!-\!$, $CH_2\!=\!CH\!-\!CH_2\!-\!$, $CH_3\!-\!CH\!=\!CH\!-\!$, $CH_2\!=\!CH\!-\!CH_2\!-\!CH_2\!-\!$, $CH_2\!=\!C(CH_3)\!-\!CH_2\!-\!CH_2\!-\!$, $(CH_3)_2C\!=\!CH\!-\!CH_2\!-\!$, $(CH_3)_2C\!=\!CH\!-\!CH_2\!-\!CH_2\!-\!$, $CH_2\!=\!C(Cl)\!-\!$, $CH_2\!=\!C(CH_3)\!-\!CH_2\!-\!$, and $CH_3\!-\!CH\!=\!CH\!-\!CH_2\!-\!$.

Among these, from the viewpoint of favorably obtaining the desired effect of the present invention, $Z^1$ and $Z^2$ are each independently preferably $CH_2\!=\!CH\!-\!$, $CH_2\!=\!C(CH_3)\!-\!$, $CH_2\!=\!C(Cl)\!-\!$, $CH_2\!=\!CH\!-\!CH_2\!-\!$, $CH_2\!=\!C(CH_3)\!-\!CH_2\!-\!$, or $CH_2\!=\!C(CH_3)\!-\!CH_2\!-\!CH_2\!-\!$, more preferably $CH_2\!=\!CH\!-\!$, $CH_2\!=\!C(CH_3)\!-\!$, or $CH_2\!=\!C(Cl)\!-\!$, and particularly preferably $CH_2\!=\!CH\!-\!$.

$A^x$ is an organic group having 2 to 30 carbon atoms and at least one aromatic ring selected from the group consisting of an aromatic hydrocarbon ring and an aromatic heterocyclic ring.

In the present invention, "aromatic ring" means a cyclic structure having aromaticity in the broad sense based on Huckel rule, that is, a cyclic conjugated structure having (4n+2) π electrons, and a structure that exhibits aromaticity by involving a lone pair of electrons in a heteroatom such as sulfur, oxygen, and nitrogen in a π electron system, typified by thiophene, furan, and benzothiazole.

The organic group having 2 to 30 carbon atoms and at least one aromatic ring selected from the group consisting of an aromatic hydrocarbon ring and an aromatic heterocyclic ring, of $A^x$, may have a plurality of aromatic rings, and may also have an aromatic hydrocarbon ring and an aromatic heterocyclic ring.

Examples of the aromatic hydrocarbon ring may include a benzene ring, a naphthalene ring, and an anthracene ring. Examples of the aromatic heterocyclic ring may include a monocyclic aromatic heterocyclic ring, such as a pyrrole ring, a furan ring, a thiophene ring, a pyridine ring, a pyridazine ring, a pyrimidine ring, a pyrazine ring, a pyrazole ring, an imidazole ring, an oxazole ring, and a thiazole ring;

and a fused aromatic heterocyclic ring, such as a benzothiazole ring, a benzoxazole ring, a quinoline ring, a phthalazine ring, a benzimidazole ring, a benzopyrazole ring, a benzofuran ring, a benzothiophene ring, a thiazolopyridine ring, an oxazolopyridine ring, a thiazolopyrazine ring, an oxazolopyrazine ring, a thiazolopyridazine ring, an oxazolopyridazine ring, a thiazolopyrimidine ring, and an oxazolopyrimidine ring.

The aromatic ring of $A^x$ may have a substituent. Examples of the substituent may include a halogen atom, such as a fluorine atom and a chlorine atom; a cyano group; an alkyl group having 1 to 6 carbon atoms, such as a methyl group, an ethyl group, and a propyl group; an alkenyl group having 2 to 6 carbon atoms, such as a vinyl group and an allyl group; a halogenated alkyl group having 1 to 6 carbon atoms, such as a trifluoromethyl group; a substituted amino group, such as a dimethylamino group; an alkoxy group having 1 to 6 carbon atoms, such as a methoxy group, an ethoxy group, and an isopropoxy group; a nitro group; an aryl group, such as a phenyl group and a naphthyl group; $-C(\!=\!O)\!-\!R^5$; $-C(\!=\!O)\!-\!OR^5$; and $-SO_2R^6$. Herein, $R^5$ is an alkyl group having 1 to 20 carbon atoms, an alkenyl group having 2 to 20 carbon atoms, or a cycloalkyl group having 3 to 12 carbon atoms, and $R^6$ is an alkyl group having 1 to 20 carbon atoms, an alkenyl group having 2 to 20 carbon atoms, a phenyl group, or a 4-methylphenyl group, which are the same as those for $R^4$ described below.

The aromatic ring of $A^x$ may have a plurality of substituents that may be the same or different, and two adjacent substituents may be bonded together to form a ring. The formed ring may be a monocycle or a fused polycycle, and may be an unsaturated ring or a saturated ring.

The "number of carbon atoms" in the organic group having 2 to 30 carbon atoms of $A^x$ means the total number of carbon atoms in the entire organic group which excludes carbon atoms in the substituents (the same applied to $A^y$ described below).

Examples of the organic group having 2 to 30 carbon atoms and at least one aromatic ring selected from the group consisting of an aromatic hydrocarbon ring and an aromatic heterocyclic ring, of $A^x$, may include an aromatic hydrocarbon ring group; an aromatic heterocyclic ring group; an alkyl group having 3 to 30 carbon atoms and at least one aromatic ring selected from the group consisting of an aromatic hydrocarbon ring group and an aromatic heterocyclic ring group; an alkenyl group having 4 to 30 carbon atoms and at least one aromatic ring selected from the group consisting of an aromatic hydrocarbon ring group and an aromatic heterocyclic ring group; and an alkynyl group having 4 to 30 carbon atoms and at least one aromatic ring selected from the group consisting of an aromatic hydrocarbon ring group and an aromatic heterocyclic ring group.

Preferable specific examples of $A^x$ are as follows. However, in the present invention, $A^x$ is not limited to the following examples. In the following formulae, "—" represents an atomic bonding at any position of the ring (the same applied to the following).

(1) An aromatic hydrocarbon ring group

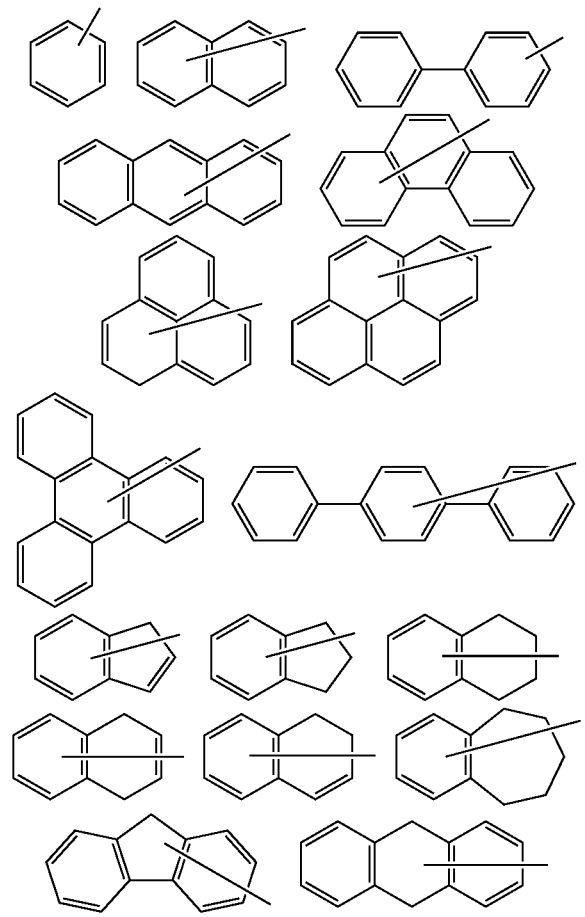

-continued

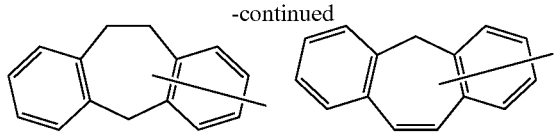

(2) An aromatic heterocyclic ring group

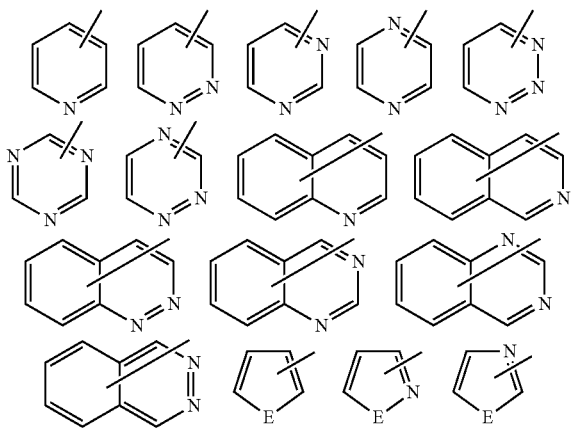

In the aforementioned formulae, E is NR$^{6a}$, an oxygen atom, or a sulfur atom. Herein, R$^{6a}$ is a hydrogen atom; or an alkyl group having 1 to 6 carbon atoms, such as a methyl group, an ethyl group, and a propyl group.

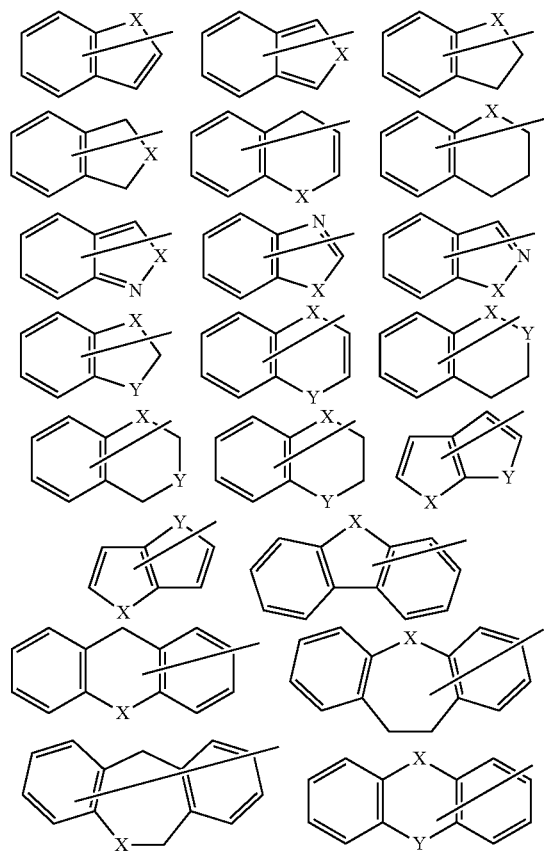

-continued

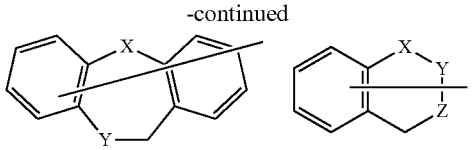

In the aforementioned formulae, X, Y, and Z are each independently NR$^7$, an oxygen atom, a sulfur atom, —SO—, or —SO$_2$— (provided that cases where an oxygen atom, a sulfur atom, —SO—, and —SO$_2$— are each adjacent are excluded). R$^7$ is a hydrogen atom; or an alkyl group having 1 to 6 carbon atoms such as a methyl group, an ethyl group, and a propyl group, which are the same as those for R$^{6a}$ described above.

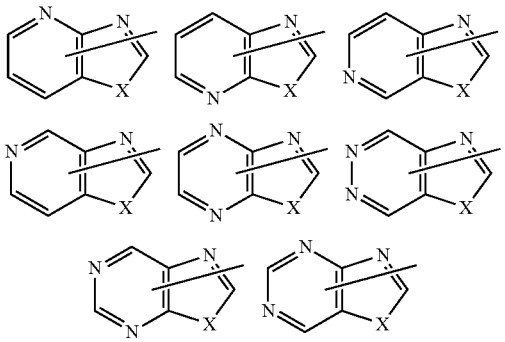

(In the aforementioned formulae, X has the same meanings as described above.)

(3) An alkyl group having at least one aromatic ring selected from the group consisting of an aromatic hydrocarbon ring group and an aromatic heterocyclic ring group

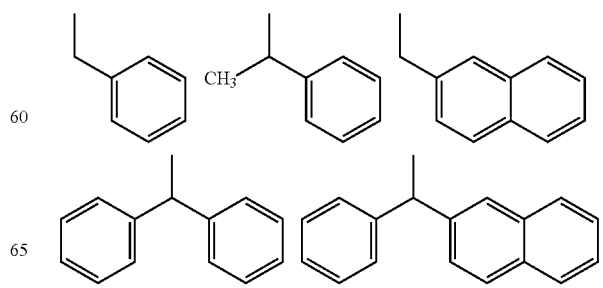

-continued

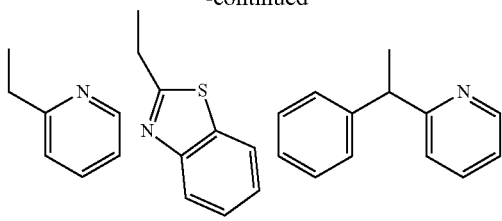

(4) An alkenyl group having at least one aromatic ring selected from the group consisting of an aromatic hydrocarbon ring group and an aromatic heterocyclic ring group

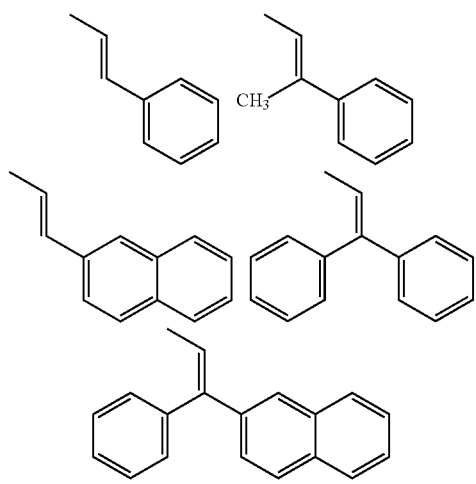

(5) An alkynyl group having at least one aromatic ring selected from the group consisting of an aromatic hydrocarbon ring group and an aromatic heterocyclic ring group

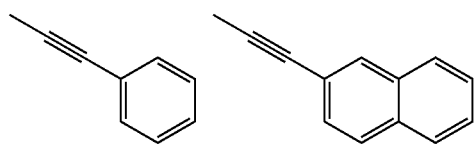

Among the groups of $A^x$, an aromatic hydrocarbon ring group having 6 to 30 carbon atoms and an aromatic heterocyclic ring group having 4 to 30 carbon atoms are preferable. Any groups shown below are more preferable.

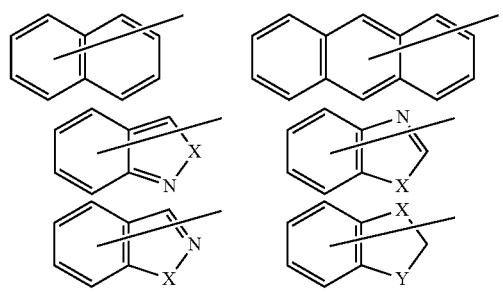

-continued

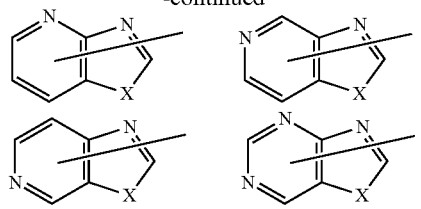

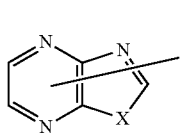

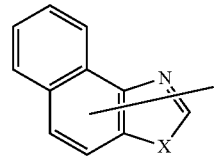

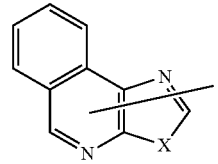

Any group shown below is further preferable.

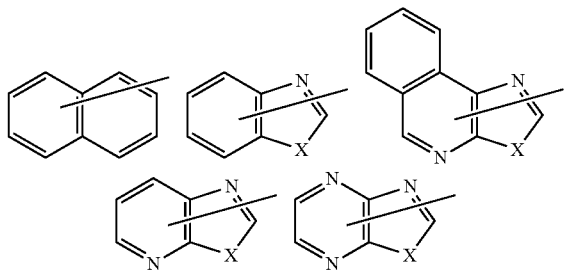

The ring of $A^x$ may have a substituent. Examples of the substituent may include a halogen atom, such as a fluorine atom and a chlorine atom; a cyano group; an alkyl group having 1 to 6 carbon atoms, such as a methyl group, an ethyl group, and a propyl group; an alkenyl group having 2 to 6 carbon atoms, such as a vinyl group and an allyl group; a halogenated alkyl group having 1 to 6 carbon atoms, such as a trifluoromethyl group; a substituted amino group, such as a dimethylamino group; an alkoxy group having 1 to 6 carbon atoms, such as a methoxy group, an ethoxy group, and an isopropoxy group; a nitro group; an aryl group, such as a phenyl group and a naphthyl group; —C(=O)—R$^8$; —C(=O)—OR$^8$; and —SO$_2$R$^6$. Herein, R$^8$ is an alkyl group having 1 to 6 carbon atoms, such as a methyl group and an ethyl group; or an aryl group having 6 to 14 carbon atoms, such as a phenyl group. Among these, a halogen atom, a cyano group, an alkyl group having 1 to 6 carbon atoms, and an alkoxy group having 1 to 6 carbon atoms are preferable.

The ring of $A^x$ may have a plurality of substituents that may be the same or different, and two adjacent substituents may be bonded together to form a ring. The formed ring may be a monocycle or a fused polycycle.

The "number of carbon atoms" in the organic group having 2 to 30 carbon atoms of $A^x$ means the total number of carbon atoms in the entire organic group which excludes carbon atoms in the substituents (the same applied to $A^y$ described below).

$A^y$ is a hydrogen atom, an alkyl group having 1 to 20 carbon atoms and optionally having a substituent, an alkenyl group having 2 to 20 carbon atoms and optionally having a substituent, a cycloalkyl group having 3 to 12 carbon atoms and optionally having a substituent, an alkynyl group having 2 to 20 carbon atoms and optionally having a substituent, —C(=O)—R$^3$, —SO$_2$—R$^4$, —C(=S)NH—R$^9$, or an organic group having 2 to 30 carbon atoms and at least one aromatic ring selected from the group consisting of an aromatic hydrocarbon ring and an aromatic heterocyclic ring. Herein, R$^3$ is an alkyl group having 1 to 20 carbon atoms and optionally having a substituent, an alkenyl group having 2 to 20 carbon atoms and optionally having a substituent, a cycloalkyl group having 3 to 12 carbon atoms and optionally having a substituent, or an aromatic hydrocarbon ring group having 5 to 12 carbon atoms; R$^4$ is an alkyl group having 1 to 20 carbon atoms, an alkenyl group having 2 to 20 carbon atoms, a phenyl group, or a 4-methylphenyl group; and R$^9$ is an alkyl group having 1 to 20 carbon atoms and optionally having a substituent, an alkenyl group having 2 to 20 carbon atoms and optionally having a substituent, a cycloalkyl group having 3 to 12 carbon atoms and optionally having a substituent, or an aromatic group having 5 to 20 carbon atoms and optionally having a substituent.

Examples of the alkyl group having 1 to 20 carbon atoms in the alkyl group having 1 to 20 carbon atoms and optionally having a substituent of A$^y$ may include a methyl group, an ethyl group, a n-propyl group, an isopropyl group, a n-butyl group, an isobutyl group, a 1-methylpentyl group, a 1-ethylpentyl group, a sec-butyl group, a t-butyl group, a n-pentyl group, an isopentyl group, a neopentyl group, a n-hexyl group, an isohexyl group, a n-heptyl group, a n-octyl group, a n-nonyl group, a n-decyl group, a n-undecyl group, a n-dodecyl group, a n-tridecyl group, a n-tetradecyl group, a n-pentadecyl group, a n-hexadecyl group, a n-heptadecyl group, a n-octadecyl group, a n-nonadecyl group, and a n-icosyl group. The number of carbon atoms in the alkyl group having 1 to 20 carbon atoms and optionally having a substituent is preferably 1 to 12, and further preferably 4 to 10.

Examples of the alkenyl group having 2 to 20 carbon atoms in the alkenyl group having 2 to 20 carbon atoms and optionally having a substituent of A$^y$ may include a vinyl group, a propenyl group, an isopropenyl group, a butenyl group, an isobutenyl group, a pentenyl group, a hexenyl group, a heptenyl group, an octenyl group, a decenyl group, an undecenyl group, a dodecenyl group, a tridecenyl group, a tetradecenyl group, a pentadecenyl group, a hexadecenyl group, a heptadecenyl group, an octadecenyl group, a nonadecenyl group, and an icocenyl group.

The number of carbon atoms in the alkenyl group having 2 to 20 carbon atoms and optionally having a substituent is preferably 2 to 12.

Examples of the cycloalkyl group having 3 to 12 carbon atoms in the cycloalkyl group having 3 to 12 carbon atoms and optionally having a substituent of A$^y$ may include a cyclopropyl group, a cyclobutyl group, a cyclopentyl group, a cyclohexyl group, and a cyclooctyl group.

Examples of the alkynyl group having 2 to 20 carbon atoms in the alkynyl group having 2 to 20 carbon atoms and optionally having a substituent of A$^y$ may include an ethynyl group, a propynyl group, a 2-propynyl group (propargyl group), a butynyl group, a 2-butynyl group, a 3-butynyl group, a pentynyl group, a 2-pentynyl group, a hexynyl group, a 5-hexynyl group, a heptynyl group, an octynyl group, a 2-octynyl group, a nonanyl group, a decanyl group, and a 7-decanyl group.

Examples of the substituents in the alkyl group having 1 to 20 carbon atoms and optionally having a substituent and the alkenyl group having 2 to 20 carbon atoms and optionally having a substituent, of A$^y$, may include a halogen atom, such as a fluorine atom and a chlorine atom; a cyano group; a substituted amino group, such as a dimethylamino group; an alkoxy group having 1 to 20 carbon atoms, such as a methoxy group, an ethoxy group, an isopropyl group, and a butoxy group; an alkoxy group having 1 to 12 carbon atoms that is substituted by an alkoxy group having 1 to 12 carbon atoms, such as a methoxymethoxy group and a methoxyethoxy group; a nitro group; an aryl group, such as a phenyl group and a naphthyl group; a cycloalkyl group having 3 to 8 carbon atoms, such as a cyclopropyl group, a cyclopentyl group, and a cyclohexyl group; a cycloalkyloxy group having 3 to 8 carbon atoms, such as a cyclopentyloxy group and a cyclohexyloxy group; a cyclic ether group having 2 to 12 carbon atoms, such as a tetrahydrofuranyl group, a tetrahydropyranyl group, a dioxolanyl group, and a dioxanyl group; an aryloxy group having 6 to 14 carbon atoms, such as a phenoxy group and a naphthoxy group; a fluoroalkoxy group having 1 to 12 carbon atoms in which at least one is substituted by a fluorine atom, such as a trifluoromethyl group, a pentafluoroethyl group, and —CH$_2$CF$_3$; a benzofuryl group; a benzopyranyl group; a benzodioxolyl group; a benzodioxanyl group; —C(=O)—R$^{7a}$; —C(=O)—OR$^{7a}$; —SO$_2$R$^{8a}$; —SR$^{10}$; an alkoxy group having 1 to 12 carbon atoms that is substituted by —SR$^{10}$; and a hydroxyl group. Herein, R$^{7a}$ and R$^{10}$ are each independently an alkyl group having 1 to 20 carbon atoms, an alkenyl group having 2 to 20 carbon atoms, a cycloalkyl group having 3 to 12 carbon atoms, or an aromatic hydrocarbon ring group having 6 to 12 carbon atoms, and R$^{8a}$ is an alkyl group having 1 to 20 carbon atoms, an alkenyl group having 2 to 20 carbon atoms, a phenyl group, or a 4-methylphenyl group, which are the same as those for R$^4$ described above.

Examples of the substituent in the cycloalkyl group having 3 to 12 carbon atoms and optionally having a substituent of A$^y$ may include a halogen atom, such as a fluorine atom and a chlorine atom; a cyano group; a substituted amino group, such as a dimethylamino group; an alkyl group having 1 to 6 carbon atoms, such as a methyl group, an ethyl group, and a propyl group; an alkoxy group having 1 to 6 carbon atoms, such as a methoxy group, an ethoxy group, and an isopropoxy group; a nitro group; an aryl group, such as a phenyl group and a naphthyl group; a cycloalkyl group having 3 to 8 carbon atoms, such as a cyclopropyl group, a cyclopentyl group, and a cyclohexyl group; —C(=O)—R$^{7a}$; —C(=O)—OR$^{7a}$; —SO$_2$R$^{8a}$; and a hydroxyl group. Herein, R$^{7a}$ and R$^{8a}$ have the same meanings as described above.

Examples of the substituent in the alkynyl group having 2 to 20 carbon atoms and optionally having a substituent of A$^y$ may include substituents that are the same as the substituents in the alkyl group having 1 to 20 carbon atoms and optionally having a substituent and the alkenyl group having 2 to 20 carbon atoms and optionally having a substituent.

In the group represented by —C(=O)—R$^3$ of A$^y$, R$^3$ is an alkyl group having 1 to 20 carbon atoms and optionally having a substituent, an alkenyl group having 2 to 20 carbon atoms and optionally having a substituent, a cycloalkyl group having 3 to 12 carbon atoms and optionally having a substituent, or an aromatic hydrocarbon ring group having 5 to 12 carbon atoms. Specific examples thereof may include those exemplified as the examples of the alkyl group having 1 to 20 carbon atoms and optionally having a substituent, the alkenyl group having 2 to 20 carbon atoms and optionally having a substituent, and the cycloalkyl group having 3 to 12 carbon atoms and optionally having a substituent, of $A^y$ described above.

In the group represented by $-SO_2-R^4$ of $A^y$, $R^4$ is an alkyl group having 1 to 20 carbon atoms, an alkenyl group having 2 to 20 carbon atoms, a phenyl group, or a 4-methylphenyl group.

Specific examples of the alkyl group having 1 to 20 carbon atoms and the alkenyl group having 2 to 20 carbon atoms, of $R^4$, may include those exemplified as the examples of the alkyl group having 1 to 20 carbon atoms and the alkenyl group having 2 to 20 carbon atoms, of $A^y$ described above.

Examples of the organic group having 2 to 30 carbon atoms and at least one aromatic ring selected from the group consisting of an aromatic hydrocarbon ring and an aromatic heterocyclic ring of $A^y$ may include those exemplified as the examples of $A^x$ described above.

Among these, $A^y$ is preferably a hydrogen atom, an alkyl group having 1 to 20 carbon atoms and optionally having a substituent, an alkenyl group having 2 to 20 carbon atoms and optionally having a substituent, a cycloalkyl group having 3 to 12 carbon atoms and optionally having a substituent, an alkynyl group having 2 to 20 carbon atoms and optionally having a substituent, $-C(=O)-R^3$, $-SO_2-R^4$, or an organic group having 2 to 30 carbon atoms and at least one aromatic ring selected from the group consisting of an aromatic hydrocarbon ring and an aromatic heterocyclic ring.

$A^y$ is further preferably a hydrogen atom, an alkyl group having 1 to 20 carbon atoms and optionally having a substituent, an alkenyl group having 2 to 20 carbon atoms and optionally having a substituent, a cycloalkyl group having 3 to 12 carbon atoms and optionally having a substituent, an alkynyl group having 2 to 20 carbon atoms and optionally having a substituent, an aromatic hydrocarbon ring group having 6 to 12 carbon atoms and optionally having a substituent, an aromatic heterocyclic ring group having 3 to 9 carbon atoms and optionally having a substituent, $-C(=O)-R^3$, or a group represented by $-SO_2-R^4$. Herein, $R^3$ and $R^4$ have the same meanings as described above.

It is preferable that substituents in the alkyl group having 1 to 20 carbon atoms and optionally having a substituent, the alkenyl group having 2 to 20 carbon atoms and optionally having a substituent, and the alkynyl group having 2 to 20 carbon atoms and optionally having a substituent, of $A^y$ are a halogen atom, a cyano group, an alkoxy group having 1 to 20 carbon atoms, an alkoxy group having 1 to 12 carbon atoms that is substituted by an alkoxy group having 1 to 12 carbon atoms, a phenyl group, a cyclohexyl group, a cyclic ether group having 2 to 12 carbon atoms, an aryloxy group having 6 to 14 carbon atoms, a hydroxyl group, a benzodioxanyl group, a phenylsulfonyl group, a 4-methylphenylsulfonyl group, a benzoyl group, or $-SR^{10}$. Herein, $R^{10}$ has the same meanings as described above.

It is preferable that substituents in the cycloalkyl group having 3 to 12 carbon atoms and optionally having a substituent, the aromatic hydrocarbon ring group having 6 to 12 carbon atoms and optionally having a substituent, and the aromatic heterocyclic ring group having 3 to 9 carbon atoms and optionally having a substituent, of $A^y$ are a fluorine atom, an alkyl group having 1 to 6 carbon atoms, an alkoxy group having 1 to 6 carbon atoms, or a cyano group.

$A^x$ and $A^y$ may form a ring together. Examples of the ring may include an unsaturated heterocyclic ring having 4 to 30 carbon atoms and optionally having a substituent and an unsaturated carbon ring having 6 to 30 carbon atoms and optionally having a substituent.

The unsaturated heterocyclic ring having 4 to 30 carbon atoms and the unsaturated carbon ring having 6 to 30 carbon atoms are not particularly restricted, and may or may not have aromaticity. Examples thereof may include rings shown below. The rings shown below are a moiety of:

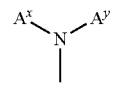

in the formula (I).

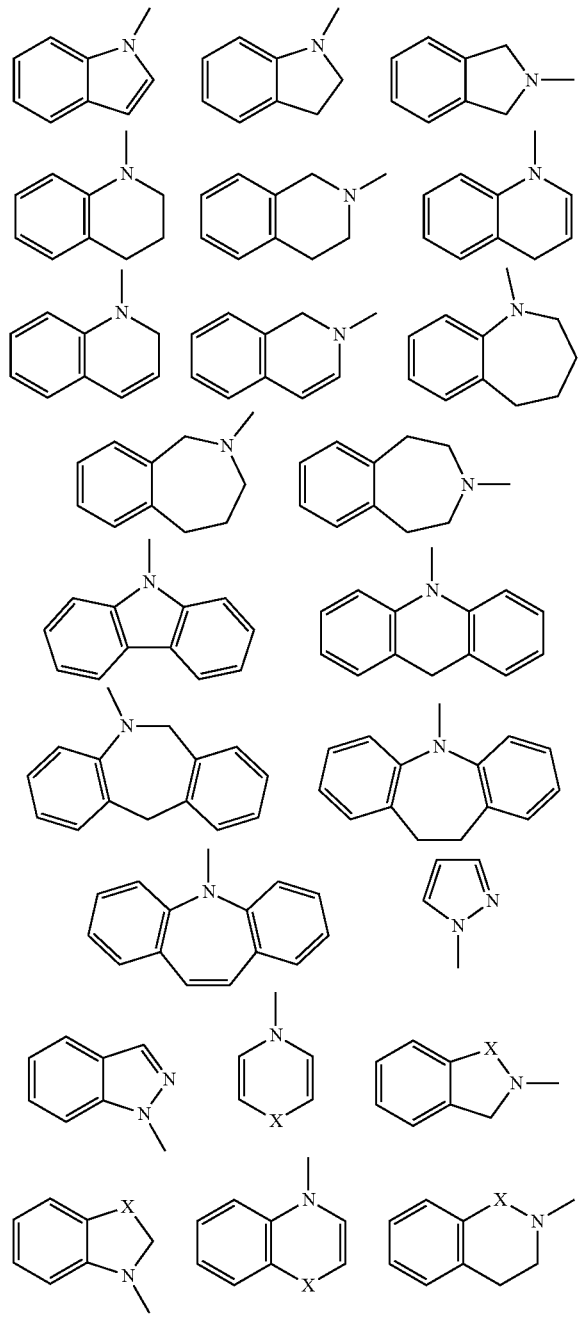

-continued

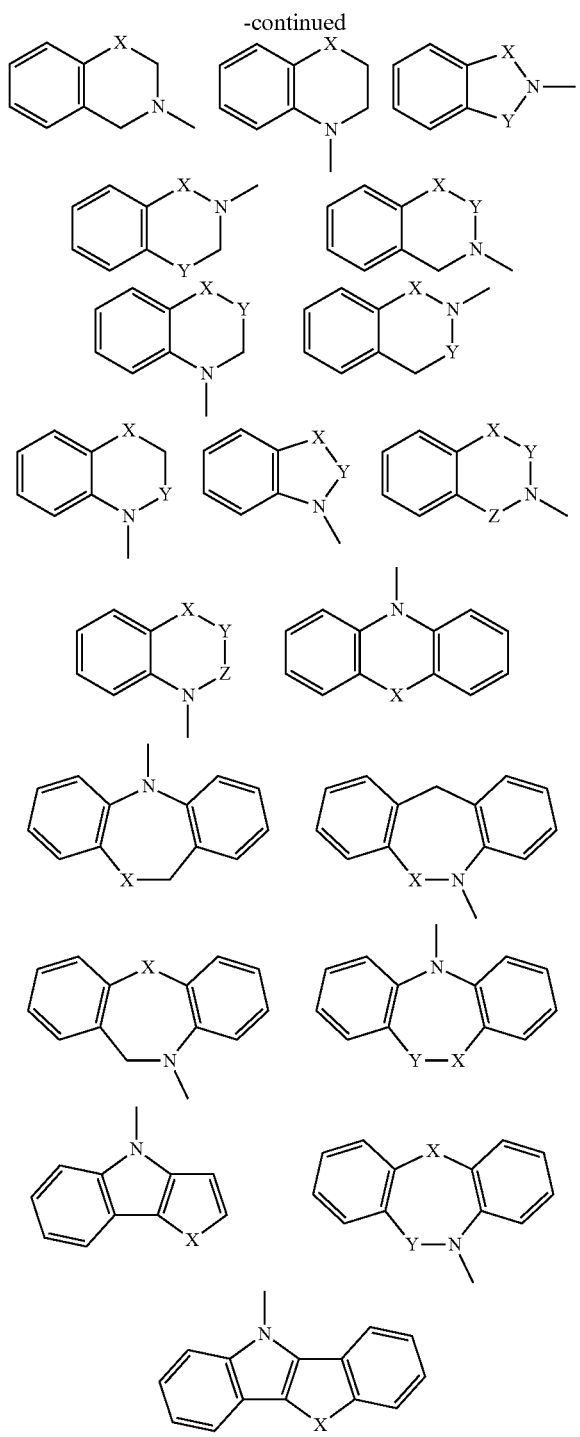

(In the formulae, X, Y, and Z have the same meanings as described above.)

The rings may have a substituent. Examples of the substituent may include those exemplified as the examples of the substituent in the aromatic ring of $A^x$.

The total number of π electrons contained in $A^x$ and $A^y$ is preferably 4 or more and 24 or less, more preferably 6 or more and 20 or less, and further preferably 6 or more and 18 or less from the viewpoint of favorably obtaining the desired effect of the present invention.

Examples of preferred combination of $A^x$ and $A^y$ may include:

(α) a combination of $A^x$ and $A^y$ in which $A^x$ is an aromatic hydrocarbon ring group having 4 to 30 carbon atoms or an aromatic heterocyclic ring group having 4 to 30 carbon atoms, $A^y$ is a hydrogen atom, a cycloalkyl group having 3 to 8 carbon atoms, an aromatic hydrocarbon ring group having 6 to 12 carbon atoms and optionally having a substituent (a halogen atom, a cyano group, an alkyl group having 1 to 6 carbon atoms, an alkoxy group having 1 to 6 carbon atoms, or a cycloalkyl group having 3 to 8 carbon atoms), an aromatic heterocyclic ring group having 3 to 9 carbon atoms and optionally having a substituent (a halogen atom, an alkyl group having 1 to 6 carbon atoms, an alkoxy group having 1 to 6 carbon atoms, or a cyano group), an alkyl group having 1 to 20 carbon atoms and optionally having a substituent, an alkenyl group having 1 to 20 carbon atoms and optionally having a substituent, or an alkynyl group having 2 to 20 carbon atoms and optionally having a substituent, and the substituent is any of a halogen atom, a cyano group, an alkoxy group having 1 to 20 carbon atoms, an alkoxy group having 1 to 12 carbon atoms that is substituted by an alkoxy group having 1 to 12 carbon atoms, a phenyl group, a cyclohexyl group, a cyclic ether group having 2 to 12 carbon atoms, an aryloxy group having 6 to 14 carbon atoms, a hydroxyl group, a benzodioxanyl group, a benzenesulfonyl group, a benzoyl group, and $—SR^{10}$; and (β) a combination of $A^x$ and $A^y$ in which $A^x$ and $A^y$ form an unsaturated heterocyclic ring or an unsaturated carbon ring together. Herein, $R^{10}$ has the same meanings as described above.

Examples of more preferred combination of $A^x$ and $A^y$ may include:

(γ) a combination of $A^x$ and $A^y$ in which $A^x$ is any of groups having the following structures, $A^y$ is a hydrogen atom, a cycloalkyl group having 3 to 8 carbon atoms, an aromatic hydrocarbon ring group having 6 to 12 carbon atoms and optionally having a substituent (a halogen atom, a cyano group, an alkyl group having 1 to 6 carbon atoms, an alkoxy group having 1 to 6 carbon atoms, or a cycloalkyl group having 3 to 8 carbon atoms), an aromatic heterocyclic ring group having 3 to 9 carbon atoms and optionally having a substituent (a halogen atom, an alkyl group having 1 to 6 carbon atoms, an alkoxy group having 1 to 6 carbon atoms, or a cyano group), an alkyl group having 1 to 20 carbon atoms and optionally having a substituent, an alkenyl group having 1 to 20 carbon atoms and optionally having a substituent, or an alkynyl group having 2 to 20 carbon atoms and optionally having a substituent, and the substituent is any of a halogen atom, a cyano group, an alkoxy group having 1 to 20 carbon atoms, an alkoxy group having 1 to 12 carbon atoms that is substituted by an alkoxy group having 1 to 12 carbon atoms, a phenyl group, a cyclohexyl group, a cyclic ether group having 2 to 12 carbon atoms, an aryloxy group having 6 to 14 carbon atoms, a hydroxyl group, a benzodioxanyl group, a benzenesulfonyl group, a benzoyl group, and $—SR^{10}$. Herein, $R^{10}$ has the same meanings as described above.

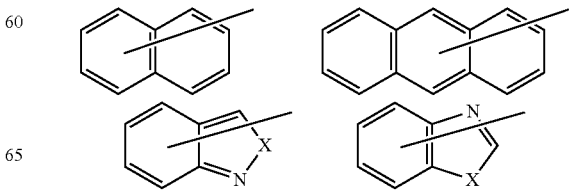

-continued

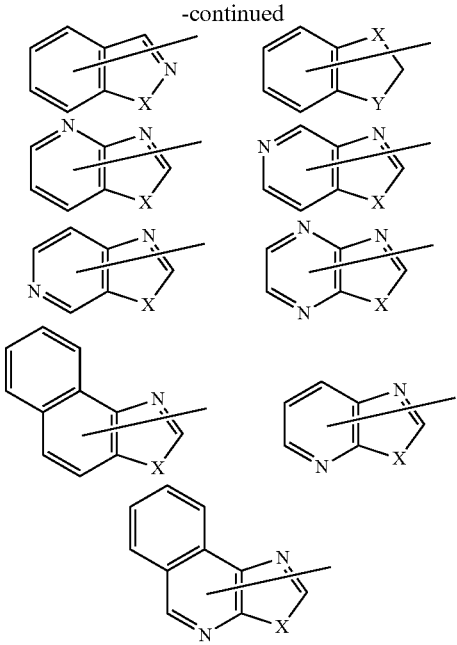

(In the formulae, X and Y have the same meanings as described above.)

Examples of particularly preferred combination of $A^x$ and $A^y$ may include:

(δ) a combination of $A^x$ and $A^y$ in which $A^x$ is any of groups having the following structures, $A^y$ is a hydrogen atom, a cycloalkyl group having 3 to 8 carbon atoms, an aromatic hydrocarbon ring group having 6 to 12 carbon atoms and optionally having a substituent (a halogen atom, a cyano group, an alkyl group having 1 to 6 carbon atoms, an alkoxy group having 1 to 6 carbon atoms, or a cycloalkyl group having 3 to 8 carbon atoms), an aromatic heterocyclic ring group having 3 to 9 carbon atoms and optionally having a substituent (a halogen atom, an alkyl group having 1 to 6 carbon atoms, an alkoxy group having 1 to 6 carbon atoms, or a cyano group), an alkyl group having 1 to 20 carbon atoms and optionally having a substituent, an alkenyl group having 1 to 20 carbon atoms and optionally having a substituent, or an alkynyl group having 2 to 20 carbon atoms and optionally having a substituent, and the substituent is any of a halogen atom, a cyano group, an alkoxy group having 1 to 20 carbon atoms, an alkoxy group having 1 to 12 carbon atoms that is substituted by an alkoxy group having 1 to 12 carbon atoms, a phenyl group, a cyclohexyl group, a cyclic ether group having 2 to 12 carbon atoms, an aryloxy group having 6 to 14 carbon atoms, a hydroxyl group, a benzodioxanyl group, a benzenesulfonyl group, a benzoyl group, and —$SR^{10}$. In the following formulae, X has the same meanings as described above. Herein, $R^{10}$ has the same meanings as described above.

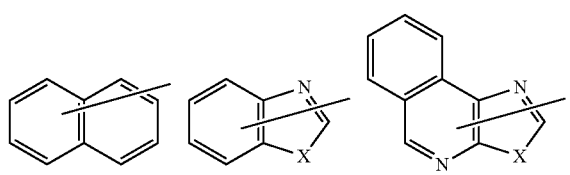

-continued

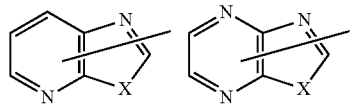

$A^1$ is a trivalent aromatic group optionally having a substituent. The trivalent aromatic group may be a trivalent carbocyclic aromatic group or a trivalent heterocyclic aromatic group. From the viewpoint of favorably obtaining the desired effect of the present invention, the trivalent aromatic group is preferably the trivalent carbocyclic aromatic group, more preferably a trivalent benzene ring group or a trivalent naphthalene ring group, and further preferably a trivalent benzene ring group or a trivalent naphthalene ring group that is represented by the following formula.

In the following formulae, substituents $Y^1$ and $Y^2$ are described for the sake of convenience to clearly show a bonding state ($Y^1$ and $Y^2$ have the same meanings as described above, and the same applied to the following).

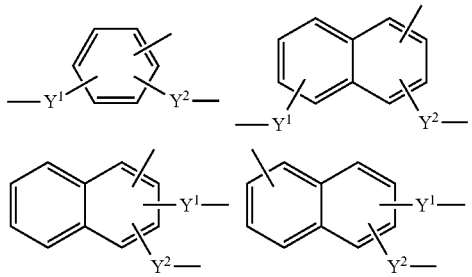

Among these, it is preferable that $A^1$ is a group represented by each of the following formulae (A11) to (A25), more preferably a group represented by the formula (A11), (A13), (A15), (A19), or (A23), and particularly preferably a group represented by the formula (A11) or (A23).

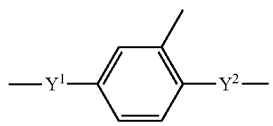
(A11)

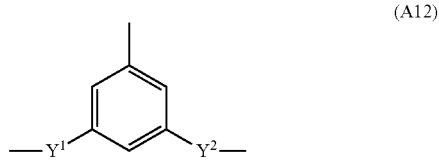
(A12)

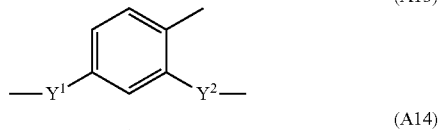
(A13)

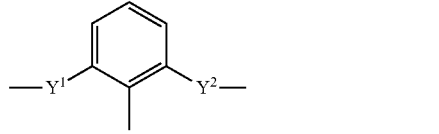
(A14)

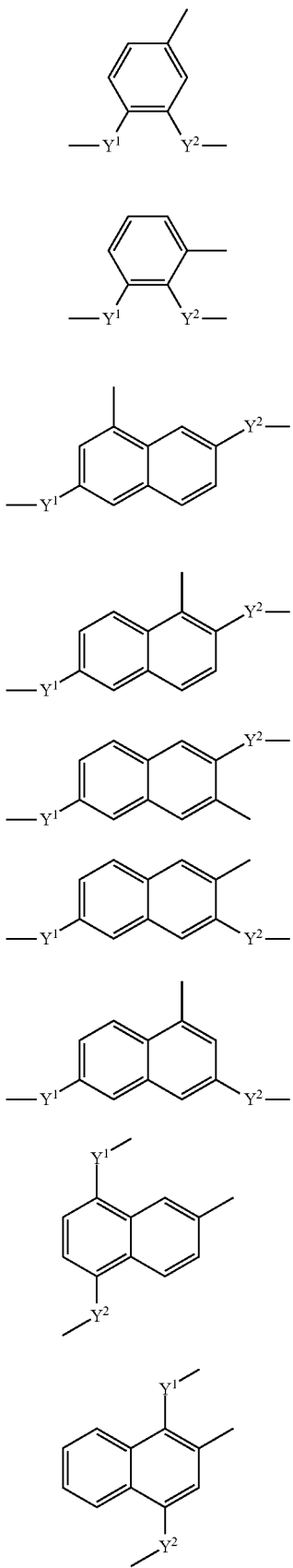

(A15)
(A16)
(A17)
(A18)
(A19)
(A20)
(A21)
(A22)
(A23)

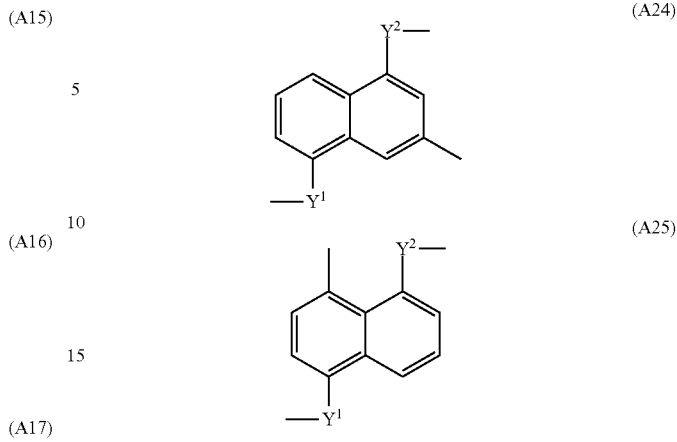

(A24)
(A25)

Examples of the substituent that may be included in the trivalent aromatic group of $A^1$ may include those exemplified as the examples of the substituent in the aromatic group of $A^x$ described above. It is preferable that $A^1$ is a trivalent aromatic group having no substituent.

$A^2$ and $A^3$ are each independently a divalent alicyclic hydrocarbon group having 3 to 30 carbon atoms and optionally having a substituent.

Examples of the divalent alicyclic hydrocarbon group having 3 to 30 carbon atoms may include a cycloalkanediyl group having 3 to 30 carbon atoms and a divalent alicyclic fused ring group having 10 to 30 carbon atoms.

Examples of the cycloalkanediyl group having 3 to 30 carbon atoms may include a cyclopropanediyl group; a cyclobutanediyl group, such as a cyclobutane-1,2-diyl group and a cyclobutane-1,3-diyl group; a cyclopentanediyl group, such as a cyclopentane-1,2-diyl group and a cyclopentane-1,3-diyl group; a cyclohexanediyl group, such as a cyclohexane-1,2-diyl group, a cyclohexane-1,3-diyl group, and a cyclohexane-1,4-diyl group; a cycloheptanediyl group, such as a cycloheptane-1,2-diyl group, a cycloheptane-1,3-diyl group, and a cycloheptane-1,4-diyl group; a cyclooctanediyl group, such as a cyclooctane-1,2-diyl group, a cyclooctane-1,3-diyl group, a cyclooctane-1,4-diyl group, and a cyclooctane-1,5-diyl group; a cyclodecanediyl group, such as a cyclodecane-1,2-diyl group, a cyclodecane-1,3-diyl group, a cyclodecane-1,4-diyl group, and a cyclodecane-1,5-diyl group; a cyclododecanediyl group, such as a cyclododecane-1,2-diyl group, a cyclododecane-1,3-diyl group, a cyclododecane-1,4-diyl group, and a cyclododecane-1,5-diyl group; a cyclotetradecanediyl group, such as a cyclotetradecane-1,2-diyl group, a cyclotetradecane-1,3-diyl group, a cyclotetradecane-1,4-diyl group, a cyclotetradecane-1,5-diyl group, and a cyclotetradecane-1,7-diyl group; and a cycloeicosanediyl group, such as a cycloeicosane-1,2-diyl group and a cycloeicosane-1,10-diyl group.

Examples of the divalent alicyclic fused ring group having 10 to 30 carbon atoms may include a decalindiyl group, such as a decalin-2,5-diyl group and a decalin-2,7-diyl group; an adamantanediyl group, such as an adamantane-1,2-diyl group and an adamantane-1,3-diyl group; and a bicyclo[2.2.1]heptanediyl group, such as a bicyclo[2.2.1]heptane-2,3-diyl group, a bicyclo[2.2.1]heptane-2,5-diyl group, and a bicyclo[2.2.1]heptane-2,6-diyl group.

The divalent alicyclic hydrocarbon groups may further have a substituent at any position. Examples of the substituent may include those exemplified as the examples of the substituent in the aromatic group of $A^x$ described above.

Among these, $A^2$ and $A^3$ are preferably a divalent alicyclic hydrocarbon group having 3 to 12 carbon atoms, more preferably a cycloalkanediyl group having 3 to 12 carbon atoms, further preferably a group represented by each of the following formulae (A31) to (A34):

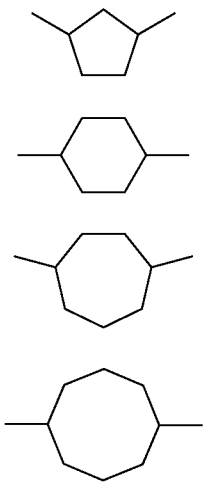

(A31)

(A32)

(A33)

(A34)

and particularly preferably the group represented by the aforementioned formula (A32).

As the divalent alicyclic hydrocarbon group having 3 to 30 carbon atoms, cis- and trans-stereoisomers that are on the basis of difference of steric configuration of carbon atoms bonded to $Y^1$ and $Y^3$ (or $Y^2$ and $Y^4$) may exist. For example, when the group is a cyclohexane-1,4-diyl group, a cis-isomer (A32a) and a trans-isomer (A32b) may exist, as described below.

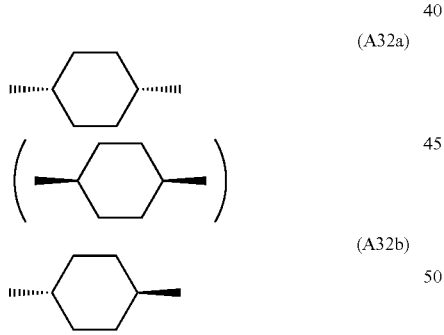

(A32a)

(A32b)

In the present invention, the group may be a cis-isomer, a trans-isomer, or an isomeric mixture of cis- and trans-isomers. The group is preferably the trans-isomer or the cis-isomer, and more preferably the trans-isomer since orientation is favorable.

$A^4$ and $A^5$ are each independently a divalent aromatic group having 6 to 30 carbon atoms and optionally having a substituent.

The aromatic group of $A^4$ and $A^5$ may be monocyclic or polycyclic.

Specific preferable examples of $A^4$ and $A^5$ may include the following ones.

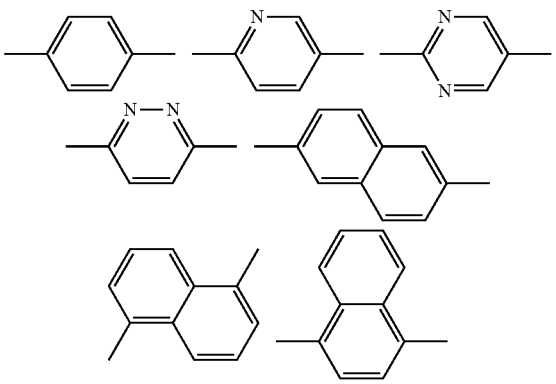

The divalent aromatic groups of $A^4$ and $A^5$ described above may have a substituent at any position. Examples of the substituent may include a halogen atom, a cyano group, a hydroxyl group, an alkyl group having 1 to 6 carbon atoms, an alkoxy group having 1 to 6 carbon atoms, a nitro group, and a —C(=O)—OR$^{8b}$ group. Herein, R$^{8b}$ is an alkyl group having 1 to 6 carbon atoms. Among these, a halogen atom, and an alkyl group and an alkoxy group having 1 to 6 carbon atoms are preferable. Of the halogen atoms, a fluorine atom is more preferable, of the alkyl groups having 1 to 6 carbon atoms, a methyl group, an ethyl group, and a propyl group are more preferable, and of the alkoxy groups, a methoxy group and an ethoxy group are more preferable.

Among these, from the viewpoint of favorably obtaining the desired effect of the present invention, $A^4$ and $A^5$ are each independently preferably a group represented by the following formula (A41), (A42), or (A43) and optionally having a substituent, and particularly preferably the group represented by the formula (A41) and optionally having a substituent.

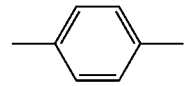

(A41)

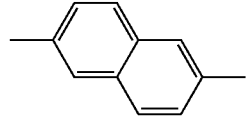

(A42)

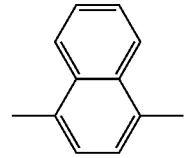

(A43)

$Q^1$ is a hydrogen atom or an alkyl group having 1 to 6 carbon atoms and optionally having a substituent.

Examples of the alkyl group having 1 to 6 carbon atoms and optionally having a substituent may include those exemplified as the examples of $A^x$ described above.

Among these, $Q^1$ is preferably a hydrogen atom or an alkyl group having 1 to 6 carbon atoms, and more preferably a hydrogen atom or a methyl group.

The compound (I) may be produced by a reaction of a hydrazine compound with a carbonyl compound, described in, for example, International publication No. WO2012/147904.

[1.7.3. Polymerizable Monomer]

The composition (A) may contain a polymerizable monomer as an optional component. Herein, the "polymerizable monomer" represents, among compounds that have polymerization ability and can act as a monomer, in particular, the compound other than the photopolymerizable liquid crystal compound having inverse wavelength dispersion.

As the polymerizable monomer, for example, a compound having one or more polymerizable groups per one molecule may be used. When the polymerizable monomer has such a polymerizable group, polymerization can be achieved in formation of the optically anisotropic layer. When the polymerizable monomer is a crosslinkable monomer having two or more polymerizable groups per one molecule, crosslinking polymerization can be achieved. Examples of the polymerizable groups may include groups that are the same as the groups of $Z^1$—$Y^7$— and $Z^2$—$Y^8$— in the compound (I). More specific examples thereof may include an acryloyl group, a methacryloyl group, and an epoxy group.

The polymerizable monomer itself may have liquid crystallinity or non-liquid crystallinity. Herein, the polymerizable monomer itself that has "non-liquid crystallinity" means that even when the polymerizable monomer itself is left at any temperature of room temperature to 200° C., the monomer does not exhibit orientation on the substrate film that has been subjected to an orientation treatment. The presence or absence of orientation is determined by whether light-dark contrast appears during rotation of the rubbing direction in the face in cross-Nicol transmission observation with a polarized light microscope.

The content ratio of the polymerizable monomer in the composition (A) is usually 1 to 100 parts by weight, and preferably 5 to 50 parts by weight, relative to 100 parts by weight of the photopolymerizable liquid crystal compound having inverse wavelength dispersion. When the content ratio of the polymerizable monomer is appropriately adjusted within the aforementioned range so as to exhibit desired inverse wavelength dispersion characteristics, the inverse wavelength dispersion characteristics are easily controlled with precision.

The polymerizable monomer may be produced by a known production method. When the polymerizable monomer has a structure similar to the compound (I), the polymerizable monomer may be produced in accordance with a method for producing the compound (I).

[1.7.4. Other Component in Composition (A)]

If necessary, the composition (A) may contain an optional component, such as those exemplified below, in addition to the photopolymerizable liquid crystal compound and the polymerizable monomer.

The composition (A) may contain a photopolymerization initiator. The polymerization initiator may be appropriately selected depending on the types of polymerizable groups of the photopolymerizable liquid crystal compound, the polymerizable monomer, and other polymerizable compounds in the composition (A). For example, when the polymerizable group has radical polymerizability, a radical polymerization initiator may be used. When the polymerizable group is an anionic polymerizable group, an anionic polymerization initiator may be used. When the polymerizable group is a cationic polymerizable group, a cationic polymerization initiator may be used.

Examples of the radical polymerization initiator may include a photo-radical generator, which is a compound that generates, in response to light irradiation, active species that is capable of initiating polymerization of polymerizable compounds.

Examples of the photo-radical generator may include an acetophenone-based compound, a biimidazole-based compound, a triazine-based compound, an O-acyl oxime-based compound, an onium salt-based compound, a benzoin-based compound, a benzophenone-based compound, an α-diketone-based compound, a polynuclear quinone-based compound, a xanthone-based compound, a diazo-based compound, and an imide sulfonate-based compound, which are described in International publication No. WO2012/147904.

Examples of the anionic polymerization initiator may include an alkyl lithium compound; a monolithium salt or a monosodium salt of biphenyl, naphthalene, and pyrene; and a polyfunctional initiator, such as a dilithium salt and a trilithium salt.

Examples of the cationic polymerization initiator may include a protonic acid, such as sulfuric acid, phosphoric acid, perchloric acid, and trifluoromethanesulfonic acid; a Lewis acid, such as boron trifluoride, aluminum chloride, titanium tetrachloride, and tin tetrachloride; an aromatic onium salt, and a combination of an aromatic onium salt with a reductant.

Specific examples of commercially available photopolymerization initiators may include trade name "Irgacure 379EG" (manufactured by BASF).

As the polymerization initiator, one type thereof may be solely used, and two or more types thereof may also be used in combination at any ratio.

The content ratio of the polymerization initiator in the composition (A) is usually 0.1 to 30 parts by weight, and preferably 0.5 to 10 parts by weight, relative to 100 parts by weight of the polymerizable compound.

The composition (A) may contain a surfactant for adjustment of surface tension. Although the surfactant is not particularly limited, a nonionic surfactant is usually preferable. As the nonionic surfactant, a commercially available product may be used. For example, a nonionic surfactant that is an oligomer having a molecular weight of several thousands may be used. Specifically, as the surfactant, PolyFox "PF-151N", "PF-636", "PF-6320", "PF-656", "PF-6520", "PF-3320", "PF-651", or "PF-652" available from OMNOVA Solutions Inc.; FTERGENT "FTX-209F", "FTX-208G", "FTX-204D", or "601AD" available from NEOS COMPANY LIMITED; or SURFLON "KH-40" or "S-420" available from Seimi Chemical Co., Ltd., may be used. As the surfactant, one type thereof may be solely used, and two or more types thereof may also be used in combination at any ratio. The content ratio of the surfactant in the composition (A) is usually 0.01 to 10 parts by weight, and preferably 0.1 to 2 parts by weight, relative to 100 parts by weight of the polymerizable compound.

The composition (A) may contain a solvent such as an organic solvent. Examples of the organic solvent may include hydrocarbons, such as cyclopentane and cyclohexane; ketones, such as cyclopentanone, cyclohexanone, methyl ethyl ketone, acetone, and methyl isobutyl ketone; acetic acid esters, such as butyl acetate and amyl acetate; halogenated hydrocarbons, such as chloroform, dichloromethane, and dichloroethane; ethers, such as 1,4-dioxane, cyclopentyl methyl ether, tetrahydrofuran, tetrahydropyran, 1,3-dioxolane, and 1,2-dimethoxyethane; and an aromatic hydrocarbon, such as toluene, xylene, and mesitylene. The boiling point of the solvent is preferably 60 to 250° C., and more preferably 60 to 150° C. from the viewpoint of excellent handleability. The amount of the solvent used is usually 100 to 1,000 parts by weight relative to 100 parts by weight of the polymerizable compound.

The composition (A) may further contain an optional additive, such as a metal, a metal complex, a dye, a pigment, a fluorescent material, a phosphorescent material, a leveling agent, a thixotropic agent, a gelator, a polysaccharide, an ultraviolet ray absorber, an infrared ray absorber, an antioxidant, an ion exchange resin, and a metal oxide, such as titanium oxide. The content ratio of each of such optional additives in the polymerizable composition of the present invention is usually 0.1 to 20 parts by weight relative to 100 parts by weight of the polymerizable compound.

The composition (A) may be usually prepared by mixing the components described above.

[2. Optical Film]

The optical film of the present invention includes, in this order, an adherend, an adhesive layer, and an optically anisotropic layer. That is, the optical film of the present invention has a structure in which the three layers are stacked in this order, including an adherend layer, an optically anisotropic layer, and an adhesive layer bonding these two layers.

The optical film of the present invention may be composed only of one adherend layer, one adhesive layer, and one optically anisotropic layer, that is, may have a layer structure of (adherend)/(adhesive layer)/(optically anisotropic layer). Alternatively, the optical film may have more layers. For example, the optical film of the present invention may be composed of one adherend layer, two adhesive layers, and two optically anisotropic layers, that is, may have a layer structure of (adherend)/(adhesive layer)/(optically anisotropic layer)/(adhesive layer)/(optically anisotropic layer).

[2.1. Adherend]

The adherend may be made of any material that may express an optical effect together with the optically anisotropic layer. In a preferred example, the adherend is a polarizing film. The optical film of the present invention may function as a circularly polarizing plate when the optical film includes a polarizing film as the adherend and the optically anisotropic layer exhibiting a particular phase difference.

The polarizing film may include a polarizer expressing a polarizing function and if necessary may further include, for example, a protective film for protecting the polarizer. As the polarizer in the polarizing film, a linear polarizer may be usually used. As the linear polarizer, a known polarizer that has been used for devices such as liquid crystal display devices and other optical devices may be used. Examples of the linear polarizer may include a linear polarizer obtained by causing iodine or a dichromatic dye to be adsorbed into a polyvinyl alcohol film and then uniaxially stretching the film in a boric acid bath; and a linear polarizer obtained by causing iodine or a dichromatic dye to be adsorbed into a polyvinyl alcohol film, then stretching the film, and converting some of polyvinyl alcohol units in the molecular chains into polyvinylene units. Other examples of the linear polarizer may include polarizers having a function of separating polarized light into reflected light and transmitted light, such as a grid polarizer, a multilayer polarizer, and a cholesteric liquid crystal polarizer. Among these, a polarizer containing polyvinyl alcohol is preferred.

When natural light is caused to be incident on the polarizer used in the present invention, light polarized in one direction passes through the polarizer. The degree of polarization of the polarizer used in the present invention is not limited, but it is preferably 98% or more, and more preferably 99% or more. The average thickness of the polarizer is preferably 5 to 80 μm.

Other examples of the adherend may include an isotropic film. Examples of the material of the isotropic film may include the same materials as for that of the substrate film.

Other examples of the adherend may further include a film having optical anisotropy. Specific examples thereof may include a positive C-plate and a negative C-plate. Examples of the positive C-plate may include stretched films described in, for example, Japanese Patent No. 2818983 B and Japanese Patent Application Laid-Open No. Hei. 6-88909 A; and a copolymer of poly(N-vinylcarbazole) and polystyrene described in, for example, Japanese Patent Application Laid-Open No. 2010-126583 A. Examples of the negative C-plate may include a cellulose-based resin film, a stretched film, and a liquid crystal compound described in, for example, Japanese Patent Application Laid-Open No. 2006-285208.

[2.2. Adhesive Layer]

In the optical film of the present invention, the adhesive layer is a layer formed by curing a photocurable adhesive. The photocurable adhesive may contain a polymer or a reactive monomer. If necessary, the photocurable adhesive may further contain one or more selected from a solvent, a photopolymerization initiator, and other additives.

The photocurable adhesive is an adhesive that is capable of being cured when irradiation with light such as visible rays, ultraviolet rays, and infrared rays is applied thereonto. In particular, an adhesive that may be cured by ultraviolet rays is preferred because of easy operation.

In a preferred aspect, the photocurable adhesive contains 50% by weight or more, more preferably 70% by weight or more, of a (meth)acrylate monomer having a hydroxyl group. In the expression "the adhesive contains a certain ratio of a monomer" as used herein, the ratio of the monomer refers to the total ratio of the monomer present as the monomer itself and the monomer that is transformed to be a part of the polymer formed by polymerization of the monomer. The upper limit of the ratio of the (meth)acrylate monomer having a hydroxyl group is not limited, but the ratio may be, for example, 100% by weight or less.

Examples of the (meth)acrylate monomer having a hydroxyl group may include hydroxyalkyl (meth)acrylates, such as 4-hydroxybutyl (meth)acrylate, 2-hydroxy-3-phenoxypropyl (meth)acrylate, 2-hydroxyethyl (meth)acrylate, 2-hydroxypropyl (meth)acrylate, 2-hydroxy-3-acryloyloxypropyl methacrylate, 2-hydroxyethyl acrylate, and 2-hydroxypropyl (meth)acrylate. One type thereof may be solely used, and two or more types thereof may also be used in combination at any ratio. The amount of monomers in combination use is the total amount of the monomers.

Examples of monomers that may be contained in the photocurable adhesive other than the (meth)acrylate monomer having a hydroxyl group may include monofunctional or polyfunctional (meth)acrylate monomers free of a hydroxyl group, and compounds having one or more epoxy groups per one molecule. The ratio of the monomer other than the (meth)acrylate monomer having a hydroxyl group is not particularly limited, but it is preferably 50% by weight or less, and more preferably 30% by weight or less.

The photocurable adhesive may further contain an optional component unless advantageous effects of the present invention are significantly impaired. Examples of the optional component may include a photopolymerization initiator, a crosslinker, an inorganic filler, a polymerization inhibitor, a color pigment, a dye, a defoamer, a leveling agent, a dispersant, a light diffusion agent, a plasticizer, an antistatic agent, a surfactant, a non-responsive polymer (inactive polymer), a viscosity modifier, and a near-infrared absorber. One type thereof may be solely used, and two or more types thereof may also be used in combination at any ratio.

Examples of the photopolymerization initiator may include a radical initiator and a cationic initiator. Examples of the cationic initiator may include Irgacure 250 (diaryliodonium salt manufactured by BASF). Examples of the radical initiator may include Irgacure 184, Irgacure 819, and Irgacure 2959 (all manufactured by BASF).

The thickness of the adhesive layer is preferably 0.5 μm or more, and more preferably 1 μm or more, and is preferably 30 μm or less, more preferably 20 μm or less, and still more preferably 10 μm or less. When the thickness of the adhesive layer falls within the above-mentioned range, good adhesion can be achieved without impairing the optical properties of the optical film.

[2.3. Optically Anisotropic Layer in Optical Film]

The optically anisotropic layer in the optical film of the present invention is a layer formed by curing a composition containing a photopolymerizable liquid crystal compound. The optically anisotropic layer contains 25% by weight or less of the photopolymerizable liquid crystal compound. Such an optically anisotropic layer may be obtained by transferring the optically anisotropic layer in the optical film transfer body of the present invention described above. Therefore, the preferable method for forming the optically anisotropic layer in the optical film of the present invention, and preferable features, such as optical properties, shape, material, of the optically anisotropic layer are the same as those for the optically anisotropic layer in the optical film transfer body of the present invention described above.

[2.4. Specific Aspects of Circularly Polarizing Plate]

When the optical film of the present invention can function as a circularly polarizing plate, more specific aspects of the circularly polarizing plate may include two aspects described below.

Circularly polarizing plate (i): a circularly polarizing plate in which the adherend is a linear polarizer, the optically anisotropic layer is a λ/4 wavelength plate, and the angle of the slow axis of the λ/4 wavelength plate relative to the transmission axis or the absorption axis of the linear polarizer is 45° or close to 45° (for example, 45°±5°, preferably 45°±4°, more preferably 45°±3°).

Circularly polarizing plate (ii): a circularly polarizing plate produced by attaching a long-length λ/4 wavelength plate, a long-length λ/2 wavelength plate, and a long-length linear polarizer together by roll-to-roll processing, wherein the long-length λ/4 wavelength plate or the long-length λ/2 wavelength plate or both of these wavelength plates are optically anisotropic layers separated from the optical film transfer body of the present invention.

In the circularly polarizing plate (ii), the relationship of the slow axis of the λ/4 wave plate, the slow axis of the λ/2 wave plate, and the absorption axis of the linear polarizer may be any of various known relationships. For example, when the optically anisotropic layer of the optical film transfer body of the present invention is used for both the λ/4 wave plate and the λ/2 wave plate, a relationship in which the angle of the direction of the slow axis of the λ/2 wave plate relative to the direction of absorption axis of the polarizer is 15° or an angle close to 15° (for example, 15°±5°, preferably 15°±4°, and more preferably 15°±3°) and the angle of the direction of the slow axis of the λ/4 wave plate relative to the direction of absorption axis of the polarizer is 75° or an angle close to 75° (for example, 75°±5°, preferably 75°±4°, and more preferably 75°±3°) may be established. By having such an aspect, the circularly polarizing plate can be used as a broadband anti-reflective film for an organic electroluminescent display device.

When the optical film of the present invention is a circularly polarizing plate and used in a display device, a change in phase difference caused by the adhesive is small, whereby the phase difference is unlikely to deviate from the optimum value, and a change in hue due to a change in phase difference (the phenomenon in which the display surface appears blue or red) can thereby be reduced.

In a product according to the present invention (optical film transfer body, circularly polarizing plate, display device, etc.), the relationships of angles formed between a direction of an in-plane optical axis (slow axis, absorption axis, etc.) and geometric directions (the long-length and short-length directions of the film, etc.) are defined such that a shift in a certain direction is positive, and a shift in another direction is negative, and the positive and negative directions are commonly defined for components of the product. For example, in a circularly polarizing plate, "the direction of the slow axis of the λ/2 wave plate relative to the direction of absorption axis of the linear polarizer is 15° and the direction of the slow axis of the λ/4 wave plate relative to the direction of absorption axis of the linear polarizer is 75°" represents two cases described below:

When the circularly polarizing plate is observed from one face thereof, the direction of the slow axis of the λ/2 wave plate shifts clockwise by 15° from the direction of absorption axis of the linear polarizer and the direction of the slow axis of the λ/4 wave plate shifts clockwise by 75° from the direction of absorption axis of the linear polarizer.

When the circularly polarizing plate is observed from one face thereof, the direction of the slow axis of the λ/2 wave plate shifts counterclockwise by 15° from the direction of absorption axis of the linear polarizer and the direction of the slow axis of the λ/4 wave plate shifts counterclockwise by 75° from the direction of absorption axis of the linear polarizer.

[2.5. Optional Components of Optical Film]

If necessary, the optical film of the present invention may additionally include an optional layer. Examples of the optional layer may include an adhesive layer for bonding the optical film to a different member, a mat layer for improving the sliding property of the film, a hard-coat layer such as an impact-resistant polymethacrylate resin layer, an anti-reflection layer, and a stain-proofing layer.

[3. Organic Electroluminescent Display Device]

The organic electroluminescent display device of the present invention includes the optical film of the present invention.

In the organic electroluminescent display device of the present invention, the optical film is preferably a film that can function as a circularly polarizing plate, such as the circularly polarizing plates (i) and (ii) described above. Examples of applications of this circularly polarizing plate may include applications as an anti-reflection film for a display device having an organic electroluminescent element. In other words, a circularly polarizing plate having a structure such as the structure of the circularly polarizing plate (i) or (ii) is provided on the surface of a display device such that the surface of the circularly polarizing plate on the linear polarizer side faces the viewing side. By having this configuration, incident light coming from outside the device being reflected in the device is prevented from emitting to the outside of the device. As a result, undesired phenomenon such as glare on a display surface of the display device can be suppressed. Specifically, only a part of linearly polarized light in light coming from outside the device passes through the linear polarizer and then passes through the optically anisotropic layer, which converts linearly polarized light into circularly polarized light. As used herein, the term "circularly polarized light" also encompasses elliptically polarized light as long as an anti-reflective function is substantially expressed. Circularly polarized light is reflected by a component that reflects light in the device (for example, a reflective electrode in an organic electroluminescent element) and again passes through the optically anisotropic layer which converts circularly polarized light into linearly polarized light that has a polarization axis in the direction perpendicular to the polarization axis of the incident linearly polarized light. This linearly polarized light does not pass through the linear polarizer. This achieves an antireflection function. In particular, when the optically anisotropic layer has inverse wavelength dispersion and when the circularly polarizing plate is the circularly polarizing plate (ii) described above, an anti-reflection function in a wide band is achieved.

[4. Method for Producing Optical Film]

The optical film of the present invention may be produced preferably by a production method including Steps (A) to (E) described below:

Step (A): a step of preparing an optical film transfer body including a substrate film and an optically anisotropic layer formed on the substrate film by curing a composition containing a photopolymerizable liquid crystal compound;

Step (B): a step of applying a photocurable adhesive onto an adherend to form a layer of the photocurable adhesive;

Step (C): a step of attaching the optical film transfer body to the layer of the photocurable adhesive;

Step (D): a step of curing the layer of the photocurable adhesive by irradiating the layer of the photocurable adhesive with light to form an adhesive layer to provide a layered body including, in this order, the adherend, the adhesive layer, the optically anisotropic layer, and the substrate film; and Step (E): a step of separating the substrate film from the layered body.

This method will be described below as the production method the present invention.

Step (A) may be performed by producing the optical film transfer body of the present invention described above.

Step (B) may be performed by applying the photocurable adhesive described above onto the adherend described above. The adherend is preferably a polarizing film. By using a polarizing film as the adherend and using an optically anisotropic layer exhibiting a particular phase difference, an optical film that can function as a circularly polarizing plate can be produced. The application thickness of the photocurable adhesive may be appropriately controlled such that the adhesive layer after curing has a desired thickness.

Step (C) may be performed by attaching the optical film transfer body obtained in Step (A) to the layer of the photocurable adhesive obtained in Step (B). In Step (C), the layer of the photocurable adhesive and the optical film transfer body are attached to each other such that the layer of the photocurable adhesive is brought into contact with the surface of the optical film transfer body on the optically anisotropic layer side.

Step (D) is preferably performed immediately after completion of attachment in Step (C). When the period of time from completion of attachment in Step (C) to the time point of performing Step (D) is shortened, a decrease in the amount of phase difference of the optically anisotropic layer due to contact between the photocurable adhesive and the optically anisotropic layer can be made small. Specifically, the period of time from completion of attachment in Step (C) to the time point of performing Step (D) may be preferably 60 seconds or shorter, and more preferably 30 seconds or shorter. Since the method for producing the optical film of the present invention utilizes the particular optically anisotropic layer described above, the production can be performed with a small decrease in the phase difference of the optically anisotropic layer even if the period of time from completion of attachment in Step (C) to the time point of performing Step (D) is long.

The conditions for Step (D), such as the type of light used for irradiation, the irradiance amount, and the temperature, may be appropriately selected and controlled such that the layer of the photocurable adhesive is cured to form an adhesive layer. Specifically, for example, the type of light used for irradiation may be ultraviolet rays when the photocurable adhesive is an ultraviolet-curable adhesive. In a more specific example, irradiation may be performed by using a high-pressure mercury-vapor lamp under the conditions of 300 mW/cm$^2$ and 200 mJ/cm$^2$ at room temperature.

In Step (D), light irradiation may be performed from the adherend side or from the substrate film side. In order to efficiently perform light irradiation even when the adherend has low light transmittance as in the case where the adherend is a polarizing film, light irradiation is preferably performed from the substrate film side.

As a result of performing Step (D), a layered body having a layer structure of (adherend)/(adhesive layer)/(optically anisotropic layer)/(substrate film) is obtained. In Step (E), the substrate film is separated from the layered body, whereby a layered body having a layer structure of (adherend)/(adhesive layer)/(optically anisotropic layer) is obtained. The layered body obtained in Step (E) as it is may be used as the optical film of the present invention. Alternatively, for example, an optional layer may be attached to the layered body obtained in Step (E), and the resulting body may be used as the optical film of the present invention. More specifically, for example, an optically anisotropic layer may be further attached to the layered body obtained in Step (E) via an adhesive layer to provide a layered body having a layer structure of (adherend)/(adhesive layer)/(optically anisotropic layer)/(adhesive layer)/(optically anisotropic layer), which may be used as the optical film of the present invention.

EXAMPLES

Hereinafter, the present invention will be specifically described with reference to Examples. However, the present invention is not limited to Examples described below. The present invention may be freely modified and practiced without departing from the scope of claims of the present invention and the scope of their equivalents.

Unless otherwise specified, "%" and "part(s)" that represent an amount in the following description are on the basis of weight. Unless otherwise specified, operations described below were performed under conditions of normal temperature and normal pressure.

[Measurement Method]

[Method for Measuring Residual Monomer Ratio]

The photopolymerizable liquid crystal compounds used in Examples and Comparative Examples were each dissolved in a solvent (1,3-dioxolane) to prepare solutions with various concentrations for creating a calibration curve. These solutions were subjected to HPLC, and the calibration curve was created.

From each of the optical film transfer bodies obtained in Examples and Comparative Examples, a 10 cm×10 cm area of the optically anisotropic layer was scraped off with a spatula and placed in a vial, which was then weighed. 1 g of a solvent (1,3-dioxolane) was further added, which was then allowed to stand for 24 hours. The mixture was filtered through a 0.45-μm filter once to extract an unreacted monomer, whereby an extraction liquid was obtained. The obtained extraction liquid was analyzed by HPLC, and the measurement results were compared with the calibration curve to obtain the residual monomer ratio.

The conditions for HPLC were as described below.

Column: LC 1200 (manufactured by Agilent Technologies)

Column temperature: 40° C.

Carrier (water:acetonitrile)

Linear concentration gradient from (water:acetonitrile=5:95) at 0 min to (water:acetonitrile=0:100) at 5 min and then (water:acetonitrile=0:100) for 25 min Elution time of residual monomer: around 13.2 min

[Measurement of Rate of Decrease in Phase Difference]

The surfaces of the optical film transfer bodies obtained in Examples and Comparative Examples on the optically anisotropic layer side were each subjected to a corona treatment. Furthermore, the surface of a glass plate was subjected to a corona treatment. These corona-treated surfaces were attached to each other, and the substrate film was separated, so that the optically anisotropic layer was transferred from the substrate film onto the glass plate, whereby a layered body including the optically anisotropic layer and the glass plate was obtained.

The phase difference in the in-plane direction $Re_0$ of the optically anisotropic layer in the obtained layered body at 550 nm was measured with a phase difference meter (trade name "AxoScan" manufactured by Axometrics, Inc.).

Subsequently, the adhesive used in Examples and Comparative Examples was applied onto the surface of the layered body on the optically anisotropic layer side. The thickness of the adhesive applied was 1 mm. The phase difference in the in-plane direction $Re_1$ of the optically anisotropic layer at 550 nm was measured again 10 minutes after application. The rate (%) of decrease in phase difference was obtained from the formula of $((Re_0-Re_1)/Re_0)\times 100$.

Production Example 1

[Preparation of Ultraviolet-Curable Adhesive (A)]

70 parts of "2-hydroxy-3-acryloyloxypropyl methacrylate" (trade name: LIGHT ESTER G-201P manufactured by Kyoeisha Chemical Co., Ltd.), which is a (meth)acrylate monomer including a hydroxyl group in the molecule, 27 parts of "3-methyl-1,5-pentanediol diacrylate" (trade name: LIGHT ACRYLATE MPD-A manufactured by Kyoeisha Chemical Co., Ltd.), which is an acrylate monomer free of a hydroxyl group, and 3 parts of Irgacure 2959 (trade name, manufactured by BASF), which is a photopolymerization initiator, were charged, stirred well, and degassed well. This process yielded an ultraviolet-curable adhesive (A).

Production Example 2

[Preparation of Ultraviolet-Curable Adhesive (B)]

7 parts of "2-hydroxy-3-acryloyloxypropyl methacrylate", which is a (meth)acrylate monomer including a hydroxyl group in the molecule, 90 parts of "3-methyl-1,5-pentanediol diacrylate", which is an acrylate monomer free of a hydroxyl group, and 3 parts of Irgacure 2959, which is a photopolymerization initiator, were charged, stirred well, and degassed well. This process yielded an ultraviolet-curable adhesive (B).

Example 1

(1-1: Preparation of Liquid Crystal Composition)

100 parts of a photopolymerizable liquid crystal compound (B1) having the structure represented by the formula described below, 3 parts of a photopolymerization initiator (trade name "Irgacure 379 EG" manufactured by BASF), and 0.3 parts of a surfactant (trade name "FTERGENT 601 AD" manufactured by NEOS COMPANY LIMITED) were measured out. Furthermore, a diluent solvent (cyclopentanone:1,3-dioxolane=1:1) was added so as to obtain a solid content of 22%, and the mixture was heated to 50° C. to cause dissolution. The resulting mixture was filtered through a 0.45-μm membrane filter, whereby a liquid crystal composition was prepared.

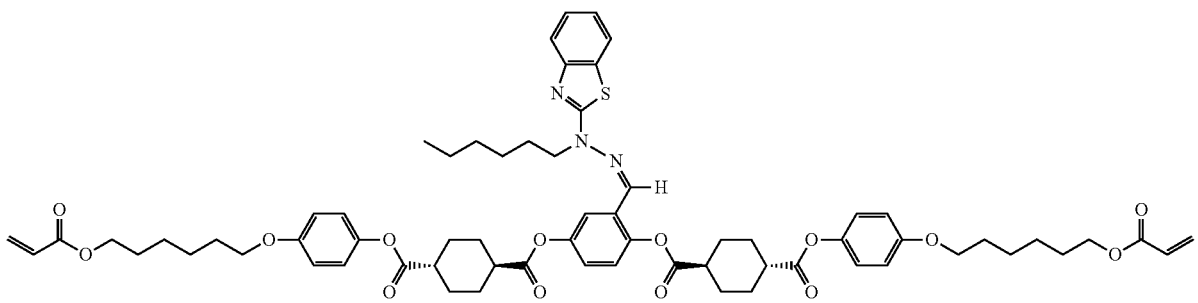 [SMILES: C=CC(=O)OCCCCCCOc1ccc(OC(=O)[C@H]2CC[C@H](C(=O)Oc3ccc(OC(=O)[C@H]4CC[C@H](C(=O)Oc5ccc(OCCCCCCOC(=O)C=C)cc5)CC4)c(/C=N\N(CCCCCC)c4nc5ccccc5s4)c3)CC2)cc1]

(1-2. Production of Optical Film Transfer Body)

As a substrate film, a diagonally stretched long-length film made of a resin containing an alicyclic structure-containing polymer (trade name "diagonally stretched ZEONOR Film, Tg 126° C.", manufactured by ZEON Corporation, thickness: 47 μm, phase difference in the in-plane direction Re at a wavelength of 550 nm: 141 nm, stretching direction: at an angle of 45° relative to the short-length direction) was prepared.

The liquid crystal composition obtained in (1-1) was applied onto the substrate film by using a die to form a layer of the liquid crystal composition. The thickness of the layer of the liquid crystal composition was controlled such that the thickness of an optically anisotropic layer to be obtained was about 2.3 μm. Subsequently, the liquid crystal composition was dried at 110° C. in an oven for about 2 minutes to evaporate the solvent in the liquid crystal composition. At the same time, the photopolymerizable liquid crystal compound was oriented in the direction in which the substrate was stretched. The layer of the dried liquid crystal composition was irradiated with ultraviolet rays by using an ultraviolet radiation device. Irradiation was performed in a nitrogen atmosphere while the substrate film was in close contact with a back roll at 60° C. by bringing the substrate film in close contact with the back roll. This process cured the photopolymerizable liquid crystal compound to form an optically anisotropic layer, whereby an optical film transfer body including the substrate film and the optically anisotropic layer was produced.

(1-3. Evaluation of Optical Film Transfer Body)

The residual monomer ratio in the optically anisotropic layer and the rate of decrease in phase difference were measured for the obtained optical film transfer body. The results are shown in Table 1.

As the adhesive for measuring the rate of decrease in phase difference, the ultraviolet-curable adhesive (A) prepared in Production Example 1 was used.

(1-4. Production of Optical Film)

As an adherend, a polarizing film (trade name "HLC2-5618S" manufactured by Sanritz Corporation, thickness: 180 μm, having a transmission axis at 0° relative to the short-length direction) was prepared. The surface of the polarizing film onto which the ultraviolet-curable adhesive (A) was to be applied was subjected to a corona treatment. Furthermore, the surface of the optical film transfer body obtained in (1-2) on the optically anisotropic layer side was subjected to a corona treatment. The ultraviolet-curable adhesive (A) obtained in Production Example 1 was applied onto the corona-treated surface of the polarizing film by using a bar coater to form a layer of the adhesive (A). The thickness of the adhesive (A) applied was about 5 μm. Subsequently, the corona-treated surface of the optical film transfer body obtained in (1-2) on the optically anisotropic layer side was placed on the layer of the adhesive (A) and attached to the layer of the adhesive (A) with a laminator. The thickness of the layer of the adhesive (A) was controlled at about 1 to 2 μm by pressing during attachment. Immediately thereafter, ultraviolet irradiation was performed from the substrate film side in an air environment by using a metal-halide light source under the conditions of a peak irradiance of 100 mW/cm$^2$ and an integrated light amount of 3000 mJ/cm$^2$. This process provided an adhesive layer formed by curing the layer of the adhesive (A), whereby a layered body having a layer structure of (adherend)/(adhesive layer)/(optically anisotropic layer)/(substrate film) was obtained.

Subsequently, the substrate film was separated from the layered body. This process provided an optical film having a layer structure of (adherend)/(adhesive layer)/(optically anisotropic layer). The optically anisotropic layer in the obtained optical film had inverse wavelength dispersion, and the cured liquid crystal molecules were oriented horizontally.

Example 2

An optical film transfer body was produced and evaluated and, in addition, an optical film was produced in the same manner as in Example 1 except that there were the following changes in the production of an optical film transfer body in (1-2).

Application was performed using a coating bar instead of using a die.

Ultraviolet irradiation was performed while the substrate film was fixed to a SUS sheet (heated to 60° C.) with a tape instead of while the substrate film was in close contact with the back roll during ultraviolet irradiation.

The evaluation results of the optical film transfer body are shown in Table 1. The residual monomer ratio in the obtained optically anisotropic layer was different from that in Example 1 because the manner of effecting close contact of the substrate film with the back roll was changed so that the temperature condition during ultraviolet irradiation was different.

The optically anisotropic layer in the obtained optical film had inverse wavelength dispersion, and the cured liquid crystal molecules were oriented horizontally.

Example 3

An optical film transfer body was produced and evaluated and, in addition, an optical film was produced in the same manner as in Example 1 except that the temperature of the back roll was changed to 25° C. in the production of an optical film transfer body in (1-2). The evaluation results of the optical film transfer body are shown in Table 1. The residual monomer ratio in the obtained optically anisotropic layer was different from that in Example 1 because the temperature of the back roll was changed so that the temperature condition during ultraviolet irradiation was different.

The optically anisotropic layer in the obtained optical film had inverse wavelength dispersion, and the cured liquid crystal molecules were oriented horizontally.

Comparative Example 1

An optical film transfer body was produced and evaluated and, in addition, an optical film was produced in the same manner as in Example 1 except that there were the following changes in the production of an optical film transfer body in (1-2).

Application was performed using a coating bar instead of using a die.

Water was applied onto the surface of the substrate film and the substrate film was then attached to a SUS sheet (heated to 25° C.) in wet conditions, which caused quick release of heat of polymerization and prevented a temperature increase in the layer of the liquid crystal composition. Ultraviolet irradiation was performed in that state, instead of being performed while the substrate film was in close contact with the back roll.

Ultraviolet irradiation was performed in the air instead of being performed in a nitrogen atmosphere.

The evaluation results of the optical film transfer body are shown in Table 1. The residual monomer ratio in the obtained optically anisotropic layer was different from that in Example 1 because the conditions for curing the photopolymerizable liquid crystal compound were changed.

Example 4

An optical film transfer body was produced and evaluated and, in addition, an optical film was produced in the same manner as in Example 1 except that the ultraviolet-curable adhesive (B) obtained in Production Example 2 was used as an adhesive instead of the ultraviolet-curable adhesive (A). The evaluation results of the optical film transfer body are shown in Table 1.

The optically anisotropic layer in the obtained optical film had inverse wavelength dispersion, and the cured liquid crystal molecules were oriented horizontally.

Example 5

An optical film transfer body was produced and evaluated and, in addition, an optical film was produced in the same manner as in Example 1 except that a photopolymerizable liquid crystal compound (A1) having a structure represented by the formula described below (trade name "LC 242"

manufactured by BASF) was used as a photopolymerizable liquid crystal compound instead of the compound (B1) in the preparation of a liquid crystal composition in (1-1). The evaluation results of the optical film transfer body are shown in Table 1.

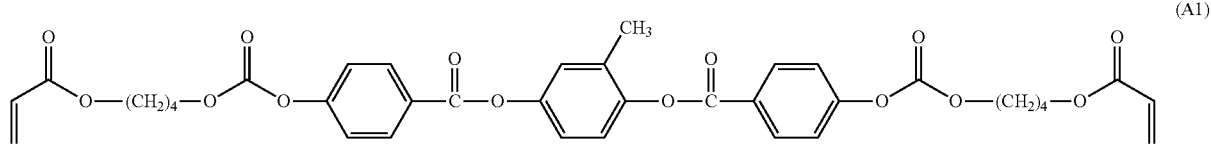

(A1)

In the optically anisotropic layer in the obtained optical film, the cured liquid crystal molecules were oriented horizontally.

Example 6

An optical film transfer body was produced and evaluated and, in addition, an optical film was produced in the same manner as in Example 5 except that the adhesive B was used as an adhesive instead of the adhesive A. The evaluation results of the optical film transfer body are shown in Table 1.

In the optically anisotropic layer in the obtained optical film, the cured liquid crystal molecules were oriented horizontally.

Comparative Example 2

In Comparative Example 1, ultraviolet irradiation was performed in a nitrogen atmosphere instead of being performed in the air, and the residual monomer content was 27%. In this case, the rate of decrease in phase difference was 47%.

The evaluation results of Examples and Comparative Examples are shown in Table 1.

Discussion

The results of Examples and Comparative Examples described above clearly show that, in the case of Examples where the residual monomer ratio of the optically anisotropic layer fell within the range defined in the present invention, the rate of decrease in phase difference was low, and thereby useful optical film transfer bodies and optical films were successfully produced.

When a photocurable adhesive containing a large ratio of the (meth)acrylate monomer having a hydroxyl group was used as a photocurable adhesive, a relatively high residual monomer ratio still resulted in a relatively low rate of decrease in phase difference.

REFERENCE SIGN LIST

10: layered body
11: substrate film
12: layer of a liquid crystal composition
21: back roll
22: light source

The invention claimed is:
1. An optical film transfer body comprising a substrate film, and an optically anisotropic layer that is formed on the substrate film by curing a composition containing a photopolymerizable liquid crystal compound,
wherein the substrate film is a stretched film, and
the optically anisotropic layer contains 2% by weight or more and 6% by weight or less of the photopolymer-

TABLE 1

| | Ex. 1 | Ex. 2 | Ex. 3 | Comp. Ex. 1 | Ex. 4 | Ex. 5 | Ex. 6 | Comp. Ex. 2 |
|---|---|---|---|---|---|---|---|---|
| Photopolymerizable liquid crystal compound type | B1 | B1 | B1 | B1 | B1 | A1 | A1 | B1 |
| Residual Monomer Ratio (%) | 6.0 | 2.7 | 21.4 | 36.4 | 6.0 | 4.1 | 4.1 | 27 |
| OH monomer ratio* (%) | 70 | 70 | 70 | 70 | 7 | 70 | 7 | 7 |
| $Re_0$ (nm) @550 nm | 143.9 | 139.9 | 136.8 | 145.0 | 142.2 | 144.5 | 150.5 | 136.5 |
| $Re_1$ (nm) @550 nm | 143.9 | 140.1 | 132.9 | 130.2 | 139.4 | 143.6 | 150.1 | 72.3 |
| Phase difference decrease rate (%) | 0.0 | 0.0 | 2.8 | 10.2 | 2.0 | 0.6 | 0.3 | 47.0 |

*OH monomer ratio: the ratio of the (meth)acrylate monomer having a hydroxyl group among monomer units that constitute the polymer in the adhesive.

izable liquid crystal compound that has not been polymerized in forming the optically anisotropic layer.

2. The optical film transfer body according to claim 1, wherein the substrate film is a resin film containing an alicyclic structure-containing polymer.

3. The optical film transfer body according to claim 1, wherein the stretched film is a diagonally stretched film.

4. The optical film transfer body according to claim 1, wherein the optically anisotropic layer contains cured liquid crystal molecules horizontally oriented relative to the substrate film.

5. An optical film comprising, in this order, an adherend, an adhesive layer, and an optically anisotropic layer, wherein
the adhesive layer is a layer formed by curing a photocurable adhesive,
the optically anisotropic layer is a layer formed by curing a composition containing a photopolymerizable liquid crystal compound, and
the optically anisotropic layer contains 2% by weight or more and 6% by weight or less of the photopolymerizable liquid crystal compound that has not been polymerized in forming the optically anisotropic layer.

6. The optical film according to claim 5, wherein the photocurable adhesive contains 50% by weight or more of a (meth)acrylate monomer having a hydroxyl group.

7. The optical film according to claim 5, wherein
the adherend is a polarizing film, and
the optical film is a circularly polarizing plate.

8. The optical film according to claim 5, wherein a phase difference of the optically anisotropic layer is 140±30 nm.

9. The optical film according to claim 5, wherein the optically anisotropic layer has inverse wavelength dispersion.

10. An organic electroluminescent display device comprising the optical film according to claim 5.

11. A method for producing the optical film according to claim 5, comprising:
Step (A) of preparing an optical film transfer body including a substrate film and an optically anisotropic layer formed on the substrate film by curing a composition containing a photopolymerizable liquid crystal compound;
Step (B) of applying a photocurable adhesive onto an adherend to form a layer of the photocurable adhesive;
Step (C) of attaching the optical film transfer body to the layer of the photocurable adhesive;
Step (D) of curing the layer of the photocurable adhesive by irradiating the layer of the photocurable adhesive with light to form an adhesive layer to provide a layered body including, in this order, the adherend, the adhesive layer, the optically anisotropic layer, and the substrate film; and
Step (E) of separating the substrate film from the layered body.

12. The method for producing the optical film according to claim 11, wherein the adherend is a polarizing film.

13. The method for producing the optical film according to claim 11, wherein, in Step (D), the light irradiation is performed from a side of the substrate film.

14. The optical film transfer body according to claim 1, wherein the photopolymerizable liquid crystal compound is a compound represented by the following formula (I):

where $A^1$ is a trivalent aromatic group optionally having a substituent;

$A^2$ and $A^3$ are each independently a divalent alicyclic hydrocarbon group having 3 to 30 carbon atoms and optionally having a substituent;

$A^4$ and $A^5$ are each independently a divalent aromatic group having 6 to 30 carbon atoms and optionally having a substituent;

$A^x$ is an organic group having 2 to 30 carbon atoms and at least one aromatic ring selected from the group consisting of an aromatic hydrocarbon ring and an aromatic heterocyclic ring;

$A^y$ is a hydrogen atom, an alkyl group having 1 to 20 carbon atoms and optionally having a substituent, an alkenyl group having 2 to 20 carbon atoms and optionally having a substituent, a cycloalkyl group having 3 to 12 carbon atoms and optionally having a substituent, an alkynyl group having 2 to 20 carbon atoms and optionally having a substituent, —C(=O)—$R^3$, —SO$_2$—$R^4$, —C(=S)NH—$R^9$, or an organic group having 2 to 30 carbon atoms and at least one aromatic ring selected from the group consisting of an aromatic hydrocarbon ring and an aromatic heterocyclic ring;

$G^1$ and $G^2$ are each independently a divalent aliphatic group optionally having a substituent and having 1 to 20 carbon atoms;

$Q^1$ is a hydrogen atom or an alkyl group having 1 to 6 carbon atoms and optionally having a substituent;

$Y^1$ to $Y^8$ are each independently a chemical single bond, —O—, —S—, —O—C(=O)—, —C(=O)—O—, —O—C(=O)—O—, —NR$^1$—C(=O)—, —C(=O)—NR$^1$—, —O—C(=O)—NR$^1$—, —NR$^1$—C(=O)—O—, —NR$^1$—C(=O)—NR$^1$—, —O—NR$^1$—, or —NR$^1$—O—; and $Z^1$ and $Z^2$ are each independently an alkenyl group having 2 to 10 carbon atoms that is unsubstituted or substituted by a halogen atom, where $R^1$ is a hydrogen atom or an alkyl group having 1 to 6 carbon atoms;

$R^3$ is an alkyl group having 1 to 20 carbon atoms and optionally having a substituent, an alkenyl group having 2 to 20 carbon atoms and optionally having a substituent, a cycloalkyl group having 3 to 12 carbon atoms and optionally having a substituent, or an aromatic hydrocarbon ring group having 5 to 12 carbon atoms;

$R^4$ is an alkyl group having 1 to 20 carbon atoms, an alkenyl group having 2 to 20 carbon atoms, a phenyl group, or a 4-methylphenyl group; and $R^9$ is an alkyl group having 1 to 20 carbon atoms and optionally having a substituent, an alkenyl group having 2 to 20 carbon atoms and optionally having a substituent, a cycloalkyl group having 3 to 12 carbon atoms and optionally having a substituent, or an aromatic group having 5 to 20 carbon atoms and optionally having a substituent.

15. The optical film according to claim 5, wherein the photopolymerizable liquid crystal compound is a compound represented by the following formula (I):

(I)

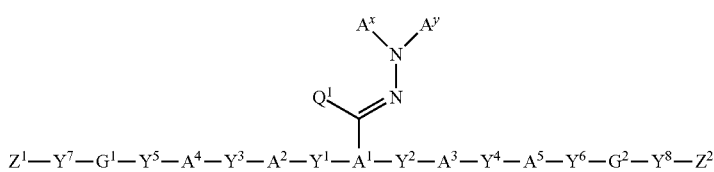

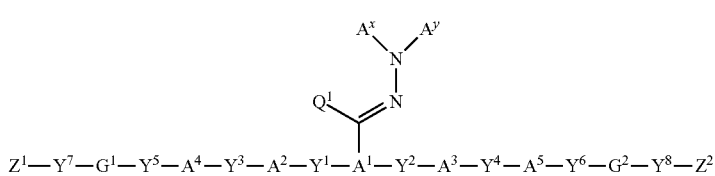

(I)

$Z^1—Y^7—G^1—Y^5—A^4—Y^3—A^2—Y^1—A^1—Y^2—A^3—Y^4—A^5—Y^6—G^2—Y^8—Z^2$ where $A^1$ is a trivalent aromatic group optionally having a substituent;

$A^2$ and $A^3$ are each independently a divalent alicyclic hydrocarbon group having 3 to 30 carbon atoms and optionally having a substituent;

$A^4$ and $A^5$ are each independently a divalent aromatic group having 6 to 30 carbon atoms and optionally having a substituent;

$A^x$ is an organic group having 2 to 30 carbon atoms and at least one aromatic ring selected from the group consisting of an aromatic hydrocarbon ring and an aromatic heterocyclic ring;

$A^y$ is a hydrogen atom, an alkyl group having 1 to 20 carbon atoms and optionally having a substituent, an alkenyl group having 2 to 20 carbon atoms and optionally having a substituent, a cycloalkyl group having 3 to 12 carbon atoms and optionally having a substituent, an alkynyl group having 2 to 20 carbon atoms and optionally having a substituent, —C(=O)—$R^3$, —SO$_2$—$R^4$, —C(=S)NH—$R^9$, or an organic group having 2 to 30 carbon atoms and at least one aromatic ring selected from the group consisting of an aromatic hydrocarbon ring and an aromatic heterocyclic ring;

$G^1$ and $G^2$ are each independently a divalent aliphatic group optionally having a substituent and having 1 to 20 carbon atoms;

$Q^1$ is a hydrogen atom or an alkyl group having 1 to 6 carbon atoms and optionally having a substituent;

$Y^1$ to $Y^8$ are each independently a chemical single bond, —O—, —S—, —O—C(=O)—, —C(=O)—O—, —O—C(=O)—O—, —NR$^1$—C(=O)—, —O—C(=O)—NR$^1$—, —NR$^1$—C(=O)—O—, —NR$^1$—C(=O)—NR$^1$—, —O—NR$^1$—, or —NR$^1$—O—; and $Z^1$ and $Z^2$ are each independently an alkenyl group having 2 to 10 carbon atoms that is unsubstituted or substituted by a halogen atom, where $R^1$ is a hydrogen atom or an alkyl group having 1 to 6 carbon atoms;

$R^3$ is an alkyl group having 1 to 20 carbon atoms and optionally having a substituent, an alkenyl group having 2 to 20 carbon atoms and optionally having a substituent, a cycloalkyl group having 3 to 12 carbon atoms and optionally having a substituent, or an aromatic hydrocarbon ring group having 5 to 12 carbon atoms;

$R^4$ is an alkyl group having 1 to 20 carbon atoms, an alkenyl group having 2 to 20 carbon atoms, a phenyl group, or a 4-methylphenyl group; and $R^9$ is an alkyl group having 1 to 20 carbon atoms and optionally having a substituent, an alkenyl group having 2 to 20 carbon atoms and optionally having a substituent, a cycloalkyl group having 3 to 12 carbon atoms and optionally having a substituent, or an aromatic group having 5 to 20 carbon atoms and optionally having a substituent.

16. The optical film transfer body according to claim 1, wherein the optically anisotropic layer is in direct contact with the substrate film.

17. The optical film transfer body according to claim 1, wherein
a direction of a slow axis of the optically anisotropic layer is the same as a direction of an orientation-regulating force of the substrate film, and
cured liquid crystal molecules are horizontally oriented in the optically anisotropic layer.

18. The optical film according to claim 5, wherein the adhesive layer is in direct contact with the optically anisotropic layer.

* * * * *